US006664163B2

(12) United States Patent
Fujishima et al.

(10) Patent No.: US 6,664,163 B2
(45) Date of Patent: Dec. 16, 2003

(54) LOW ON-RESISTANCE TRENCH LATERAL MISFET WITH BETTER SWITCHING CHARACTERISTICS AND METHOD FOR MANUFACTURING SAME

(76) Inventors: Naoto Fujishima, 36 Nebula Star Way, North York, Ontario, M2J 1M8 (CA); C. Andre T. Salama, 66 Castlewood Road, Toronto, Ontario, M5N 2L2 (CA)

(*) Notice: Subject to any disclaimer, the term of this patent is extended or adjusted under 35 U.S.C. 154(b) by 0 days.

(21) Appl. No.: 10/007,081

(22) Filed: Nov. 13, 2001

(65) Prior Publication Data

US 2002/0113263 A1 Aug. 22, 2002

Related U.S. Application Data

(63) Continuation of application No. 09/224,605, filed on Dec. 31, 1998, now Pat. No. 6,316,807, which is a continuation-in-part of application No. 08/985,762, filed on Dec. 5, 1997, now abandoned.

(51) Int. Cl.[7] .............................................. H01L 21/336
(52) U.S. Cl. ........................................ 438/270; 438/589
(58) Field of Search ................................ 438/259, 268, 438/270, 589, FOR 197

(56) References Cited

U.S. PATENT DOCUMENTS

| | | | |
|---|---|---|---|
| 4,689,871 A | 9/1987 | Malhi | 257/332 |
| 4,890,144 A | 12/1989 | Teng et al. | 257/330 |
| 4,941,026 A | 7/1990 | Temple | 257/333 |
| 4,954,854 A | 9/1990 | Dhong et al. | 257/333 |
| 5,114,865 A | 5/1992 | Kimura | 438/270 |
| 5,122,848 A | 6/1992 | Lee et al. | 257/333 |
| 5,330,927 A | * 7/1994 | Lee | 438/238 |
| 5,442,214 A | 8/1995 | Yang | 257/333 |
| 5,825,069 A | 10/1998 | Wen et al. | 257/390 |
| 5,879,971 A | 3/1999 | Witek | 438/238 |
| 6,150,210 A | * 11/2000 | Arnold | 438/243 |

OTHER PUBLICATIONS

"Smart Power Technology and The Evolution from Protective Umbrella to Complete System"; Bruno Murari; 1995 IEEE; pp. 9–15.
"An Optimized RESURF LDMOS Power Device Module Compatible with Advanced Logic Processes"; Efland et al.; 1992 IEEE; pp. 237–240.
"A New Vertical Power MOSFET Structure with Extremely Reduced On–Resistance"; Ueda et al.; IEEE Transactions on Electron Devices; vol. ED–32, No. 1; Jan. 1983; pp. 2–6.
"A trench lateral power MOSFET using self–aligned trench bottom contact holes"; Fujishima et al.; International Electron Devices Meeting; Dec. 7–10, 1997; Washington D.C.; 4 pgs.

* cited by examiner

Primary Examiner—Amir Zarabian
Assistant Examiner—Jamie L. Brophy
(74) Attorney, Agent, or Firm—Rossi & Associates

(57) ABSTRACT

A high-voltage and low on-resistance semiconductor device incorporates a trench structure that provides improved switching characteristics. In a preferred embodiment, a Trench Lateral Power MISFET is provided having a gate, channel and drift regions that are built on the side-walls of the trench. The process used to form the MISFET involves a self-aligned trench bottom contact hole to contact a source provided at the bottom of the trench to achieve minimum pitch and very low on-resistance. An example of a MISFET with 80 V breakdown voltage having a cell pitch of 3.4 microns is disclosed in which an on-resistance of 0.7 m$\Omega$-cm$^2$ is realized. The switching characteristics of the MISFET are twice as good as that of prior MISFET device structures.

2 Claims, 24 Drawing Sheets

| | 1st TRENCH LATERAL MISFET | 2nd TRENCH LATERAL MISFET |
|---|---|---|
| $Ron\,(m\Omega\text{-}cm^2)$ | 0.7 | 0.7 |
| $Cgd\,(nF/cm^2)$ | 22.9 | 11.4 |
| $F\,(m\Omega\text{-}nF)$ | 16.0 | 7.98 |

$F = Ron \times Cgd$
Line Width = 0.6 μm

FIG. 38 ically have values of 1.5 µm, 2.0 µm and 0.5 µm

LOW ON-RESISTANCE TRENCH LATERAL MISFET WITH BETTER SWITCHING CHARACTERISTICS AND METHOD FOR MANUFACTURING SAME

CROSS-REFERENCE TO RELATED APPLICATIONS

This application is a continuation application, and claims priority from, U.S. patent application Ser. No. 09/224,605 filed on Dec. 31, 1998 now U.S. Pat. No. 6,316,807, which in turn is a continuation-in-part application, and claims priority from, U.S. patent application Ser. No. 08/985,762 filed on Dec. 5, 1997 now abandoned.

FIELD OF THE INVENTION

The invention relates in general to lateral semiconductor devices including a trench structure, and a method of manufacturing such devices. More specifically, the invention relates to MISFETs with a high breakdown voltage and a low on-resistance, which can be incorporated in integrated circuits, power supplies, motors and other devices.

BACKGROUND OF THE INVENTION

An example of one type of conventional high voltage lateral MISFETs with low on-resistance characteristics is shown in FIG. 1. A high resistive n⁻ extended drain 10 is formed in a p⁻ substrate 8 between a p base region 12 and an n⁺ drain region 14 to reduce an electric field between a source region 16 and the drain region 14. A gate oxide layer 18 under a gate electrode 20 is thicker at the drain side in order to reduce electric field in the n⁻ extended drain 10. Generally, lateral MISFETs consist of the following four regions shown in FIG. 1: (1) a source region with a distance of $l_1$, (2) a channel region with a distance of $l_2$, (3) an extended drain region with a distance of $l_3$, and (4) a drain region with a distance of $l_4$. The pitch of the device is the sum of $l_1+l_2+l_3+l_4$ and determines the packing density of the device and its specific on-resistance. The smaller the pitch, the higher the packing density and the lower the on-resistance per unit area. Present state of the art MISFETs with a breakdown voltage of 80 V require $l_3$ to be 3 µm to reduce the electric field near the drain and prevent premature breakdown. The remaining parameters ($l_1$, $l_2$, and $l_4$) do not influence the breakdown voltage significantly and are required to be 1.5 µm, 2 µm, and 1.5 µm respectively for $l_1$, $l_2$ and $l_4$ (for a 1 µm design rule). Thus, the distance or length of the n⁻ extended drain 10 is the largest among all of the regions and must be increased as the breakdown voltage of the MISFET increases. As a result, the packing density of the MISFET is sacrificed and on-resistance increases. MISFETS with the above-described structure have already been described. See, for example, T. Efland, et al., "Self-Aligned RESURF To LOCOS Region LDMOS Characterization shows Excellent Rsp vs BV Performance" Proceedings ISPSD'96, pp. 147–150, 1996, the contents of which are incorporated herein by reference.

Results of on-state simulations performed for the structure shown in FIG. 1 with a substrate doping level of $7 \times 10^{14}$ cm⁻³, an n⁻ extended drain surface doping concentration of $7 \times 10^{17}$ cm⁻³, and a junction depth of 1.4 µm are illustrated in FIG. 2. For such simulations, the specific on-resistance of the device is estimated to be 1.6 mΩ-cm² for a breakdown voltage of 80 V.

To overcome the packing density limitation discussed above, MISFETs using trench structures have been proposed by N. Fujishima, et al. in U.S. patent application Ser. No. 08/547,910. As illustrated in FIG. 3, a channel 24 and an n⁻ extended drain 26 are located vertically at a side-wall of a trench formed in a substrate 28. Since the trench MISFET has the n⁻ extended drain 26 between a source region 31 and a drain region 32, and a thick gate oxide 34 between a gate electrode 36 and the drain region 32, it is possible to optimize the structure to get almost the same current handling capability in the unit cell as the conventional MISFET without reducing the breakdown voltage. The pitch in this case is determined by the sum of $l_1$, $l_6$, and $l_5$, which typically have values of 1.5 µm, 2.0 µm and 0.5 µm respectively (for minimum 1 µm design rules) resulting in half the pitch of the structure in FIG. 1. Therefore, packing density per unit area of the MISFET can be increased and a reduction in on-resistance per unit area achieved.

However, for the device of FIG. 3, two additional masks are needed to define the silicon trench and the drain contact holes. The resulting process also requires strict alignment tolerance among these three masks. In addition, two deep directional etching steps are needed to define the gate and make the drain contact hole inside the initial silicon trench.

In view of the above, it is an object of the present invention to provide a lateral MISFET incorporating a high packing density trench structure and offering high breakdown voltage with low on-resistance and a method of manufacturing the lateral MISFET.

SUMMARY OF THE INVENTION

The present invention provides a semiconductor device incorporating a trench structure that combines high breakdown voltage with low on-resistance characteristics and a method for manufacturing the same. In a first embodiment, a Trench Lateral Power MISFET (T-LPM) is provided having a gate and channel regions that are built on the side-wall of the trench. The process used to form the T-LPM uses self-aligned trench bottom contact holes to contact a drain at the bottom of the trench to achieve minimum pitch and very low on-resistance. An example of a T-LPM with 80 V breakdown voltage having a cell pitch of four microns is disclosed in which an on-resistance of 0.8 mΩ-cm² is realized.

More specifically, a semiconductor device is provided that includes a substrate of a first conductivity type having a trench formed therein that extends from a top surface of the substrate to a defined depth into the substrate. A dielectric material is formed on sidewalls of the trench, wherein a thickness of the dielectric material at the bottom of the trench is greater than a thickness of the dielectric material at the top of the trench. A contact hole extends through the dielectric material at the bottom of the trench to the substrate. A region of a second conductivity type is formed in the substrate beneath the contact hole, and an electrical interconnection material is formed in the trench that extends from the top of the trench through the contact hole to contact the region of second conductivity type.

In the first embodiment a MISFET is provided in which a base region of the first conductivity type is formed near a surface region of the substrate adjacent to the trench, and a source region is formed at the surface of the substrate above the base region. A first conductivity type diffusion region that extends from portions of the lower side walls and bottom of the trench, and a second conductivity type extended drain region is formed in said first conductivity type diffusion region. The region of second conductivity type formed under said contact hole is located in the extended drain region. A gate is located in the trench and is separated from the side walls of the trench and the electrical interconnection material by the dielectric material.

Process steps for forming the first embodiment include:
a) forming a trench in a substrate of first conductivity type;
b) growing a pad oxide in the trench;
c) depositing a nitride layer and etching the nitride layer to leave residual nitride layers that extend from the top of the trench and along the side walls of the trench;
d) extending the depth of the trench into the substrate;
e) depositing a thick oxide layer on the top of the substrate, the portions of the sidewall of the trench not covered by the residual nitride layer and the bottom of the trench;
f) removing the residual nitride layer and pad oxide and forming a gate oxide layer on the portions of the side walls that were previously covered by the residual nitride layer;
g) forming a gate layer on the gate oxide layer;
h) forming an oxide layer over the gate layer;
i) selectively etching the oxide layer formed over the gate layer, the thick oxide layer and the gate layer so that the surface of the substrate is exposed in regions adjacent to the trench and residual films of the gate layer and the thick oxide are left at the side-walls of the trench;
j) forming an oxide layer inside the trench and on the surface of the substrate by a method where oxide growth rate is slower inside the trench than at the surface of the substrate, wherein the thickness of the oxide layer within the trench is less than the thickness of the oxide layer on the surface of the substrate;
k) etching the oxide layer at the bottom of the trench to form a contact hole that extends to the substrate while maintaining a thickness of the oxide layer on the side walls of the trench and a thickness of the oxide layer on the surface of the substrate using a directional etching method; and
l) forming an electrical interconnection material in the trench that extends through the contact hole.

In the preferred method of forming a MISFET device, a first region of the first conductivity type and a second region of a second conductivity type are formed in the substrate through the portions of the sidewall of the trench not covered by the residual nitride layer after step (d) and before step (e). A contact region of second conductivity type in the second region of second conductivity type is formed through the contact hole after step (k) and before step (i). A base of the first conductive type and a source of the second conductive type are formed in the substrate in the exposed regions adjacent to the trench after step (i) and before step (j). The second region of second conductivity type comprises an extended drain region.

In a second embodiment of the invention, a semiconductor device is provided comprising a substrate of a first conductivity type including a trench formed therein that extends from a top surface of the substrate to a defined depth into the substrate. A dielectric material formed on sidewalls of the trench, wherein a thickness of the dielectric material at the bottom of the trench is smaller than a thickness of the dielectric material at the top of the trench. A contact hole extends through the dielectric material at the bottom of the trench to the substrate. A region of a second conductivity type formed in the substrate beneath the contact hole; and an electrical interconnection material formed in the trench that extends from the top of the trench through the contact hole to contact the region of second conductivity type.

In the second embodiment a MISFET is provided in which a drain region of the second conductivity type is formed at the surface of the substrate adjacent to the trench. A first conductivity type diffusion region that extends from the upper portions of the sidewalls, and a second conductivity type extended drain region formed in said first conductivity type diffusion region. A gate located in said trench and separated from the sidewall of the trench and the electrical interconnection material by a dielectric material. A first conductivity type base at the lower portion and bottom of the trench, and a second conductive type source in said base at the lower portion and bottom of the trench. A metal drain electrode is formed on the source region, a metal electrode is formed on the electrical interconnection material and a metal electrode is extended from the gate.

Process steps for forming the second embodiment include:
a) forming a trench in a substrate of first conductive type;
b) forming in it a first region of the first conductivity type and a second region of the second conductivity type into the substrate through portions of the trench;
c) depositing an oxide layer on portions of sidewalls of trench, wherein said oxide layer extends from the top of the trench;
d) forming an extended trench with retaining said oxide layer on the upper portion of said trench sidewall;
e) forming a gate oxide layer on the portion of the sidewalls of said extended trench;
f) forming a gate layer on the gate oxide layer; selectively etching the gate layer, and the gate oxide layer so that the surface of the substrate is exposed in regions adjacent to the trench and residual films of the gate layer and the thick oxide are left on the sidewalls of the trench;
g) forming a base of the first conductivity type and a source of the second conductivity type at the bottom of the trench;
h) forming an oxide layer inside the trench and on the surface of the substrate over the drain by a method where oxide growth rate is slower inside the trench than at the surface of the substrate, wherein the thickness of the oxide layer within the trench is less than the thickness of the oxide layer on the surface of the substrate;
i) etching the oxide layer at the bottom of the trench to form a contact hole that extends to the substrate while maintaining a thickness of the oxide layer on the sidewalls of the trench and surface of the substrate using a directional etching method; and
j) forming an electrical interconnection material in the trench that extends through the contact hole.

BRIEF DESCRIPTION OF THE DRAWINGS

The invention will be described in greater detail with reference to certain preferred embodiments thereof and the accompanying drawings, wherein:

FIG. 38 is a table illustrating switching times.

DETAILED DESCRIPTION OF THE PREFERRED EMBODIMENTS

Figure 4:
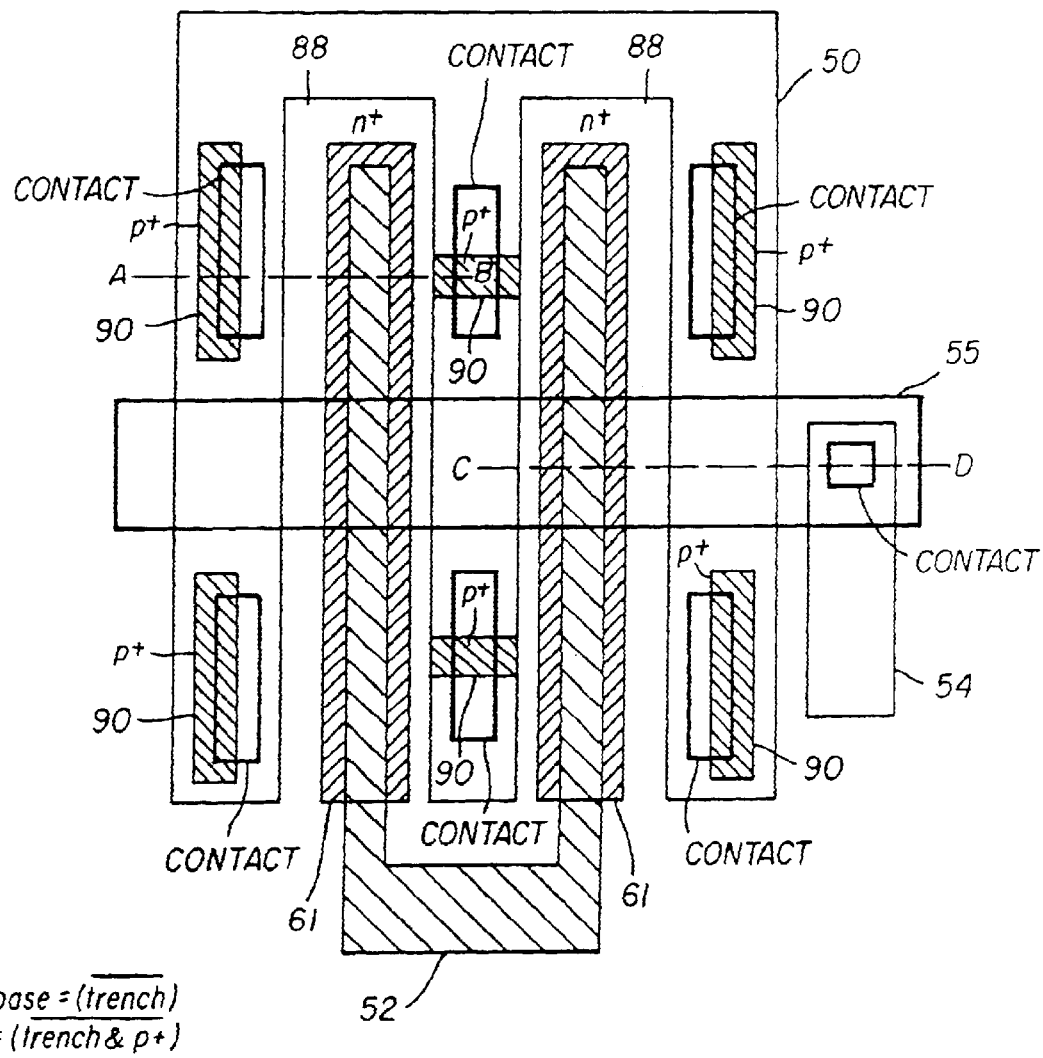
FIG. 4 is a top view of a trench lateral power MISFET in accordance with a first embodiment of the present invention.
Figure 5:
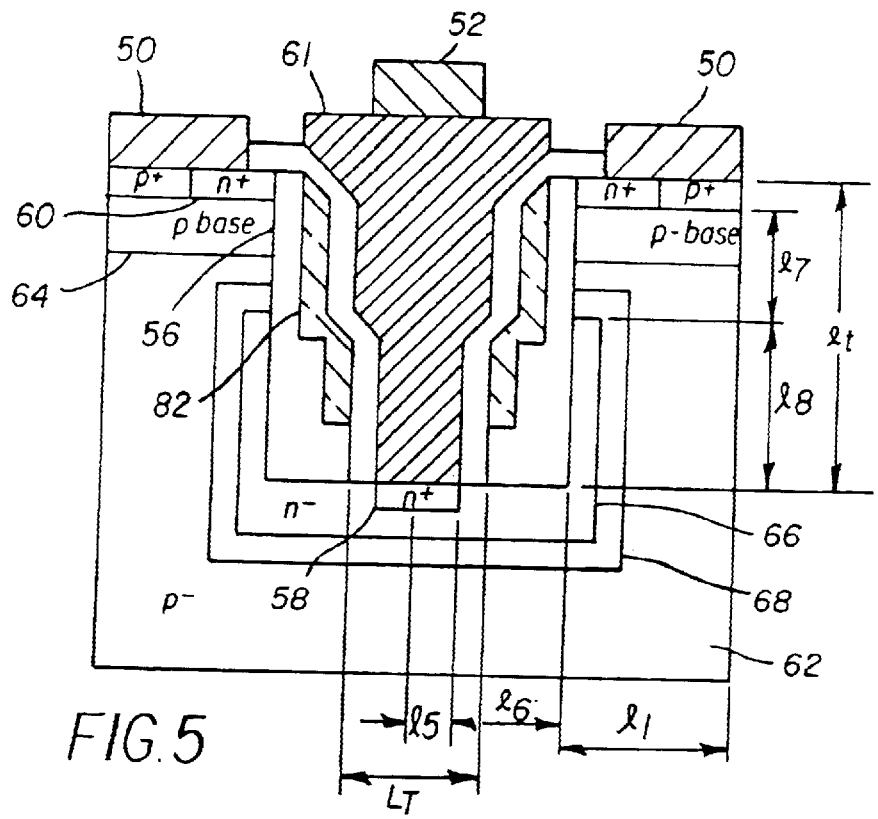
FIG. 5 is a cross-sectional view of the power MISFET illustrated in FIG. 4 taken along the line A–B.
Figure 6:
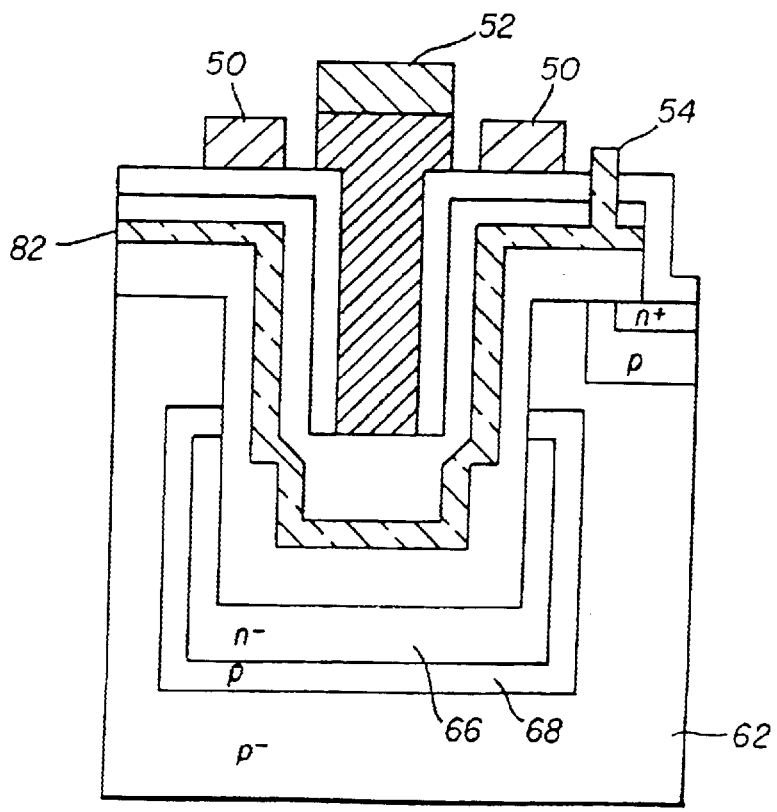
FIG. 6 is a cross-sectional view of the power MISFET illustrated in FIG. 4 taken along the line C–D.

A top view and cross-sectional view of a first embodiment of the Trench Lateral MISFET are shown in FIGS. 4, 5, and 6. In order to realize a wider channel and increase the current handling capability of the device, a source electrode 50 and a drain electrode 52 having an interdigitated form are provided as shown in FIG. 4. Cross-sectional views of an active area (taken along line A–B in FIG. 4) and a gate area 55 coupled to a gate electrode 54 (taken along line C–D in FIG. 4) are respectively shown in FIGS. 5 and 6. The MISFET has a channel region 56 along the sidewall of a trench formed in a p⁻ substrate 62, a source region 60 located at the top of the trench, and a drain region 58 located at the bottom of the trench. The trench extends from a top surface of the substrate 62 to a defined depth $l_t$, and an n⁻ extended drain 66 and p body 68 are formed around a lower portion of the trench by implantation through a window defined by the sidewalls and bottom of the trench as will be described in greater detail. The MISFET exhibits a low on-resistance and a high breakdown voltage when the impurity profile between the p body 68 and n⁻ extended drain 66 are optimized. When a positive potential higher than the threshold average is applied to the gate electrode 54, which is coupled to a polysilicon gate layer 82, an inversion layer is created along the sidewall of the trench in a p base region 64 located under the source region 60, the p⁻ substrate 62 and the p body 68. The current in the drain is collected through drain electrode 52, which is coupled to the drain region 58 at the bottom of the trench by an electrical interconnection material such as a polysilicon plug 61.

Figure 1:
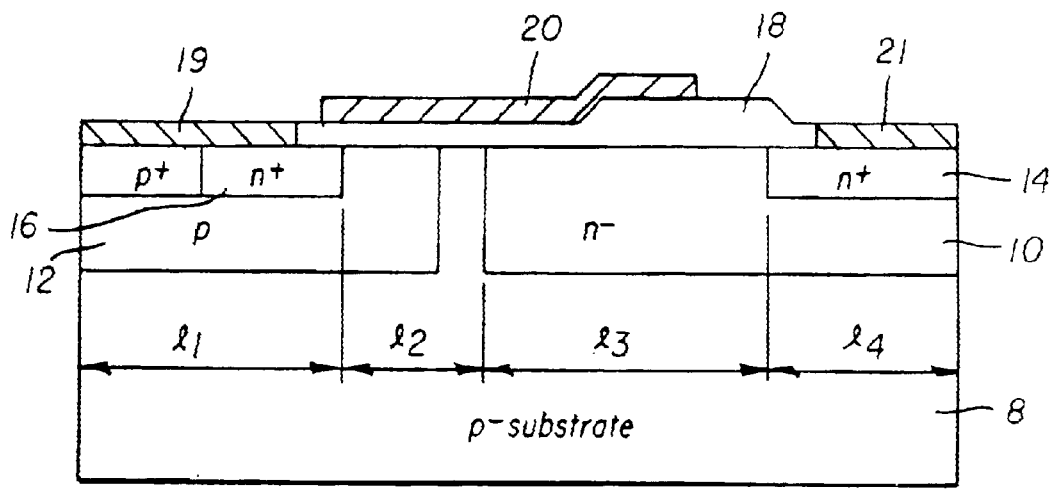
FIG. 1 is a cross-sectional view of a conventional lateral power MISFET.

In this structure, the channel region 56 and the extended drain 66 need to be long enough to achieve the required breakdown voltage. For an 80 V MISFET, the channel length $l_7$ needs to be 2 µm and the length of the extended drain $l_8$ needs to be 3 µm. However, since the structure is vertical, these dimensions do not affect the device pitch, which is determined by half the contact opening at the drain $l_5$, the lateral distance $l_6$ between the edge of the drain region 58 and the edge of the source region, and the length $l_1$ of the source region. For a 1 µm minimum design rule, $l_5$=0.5 µm, $l_6$=2 µm, and $l_1$=1.5 µm resulting in a device pitch of 4 µm, which is half the value of the pitch in the conventional MISFET of FIG. 1.

The (100) silicon plane is used to implement the device by orienting the main sidewall plane in the trench 45 degrees away from the <110> axis of the (100) orientation wafer, which results in very high electron mobility in the channel. In addition, the current in the extended drain 66 flows mainly in the bulk, instead of at the surface, thus avoiding mobility degradation due to damage associated with trench formation.

Figure 7:
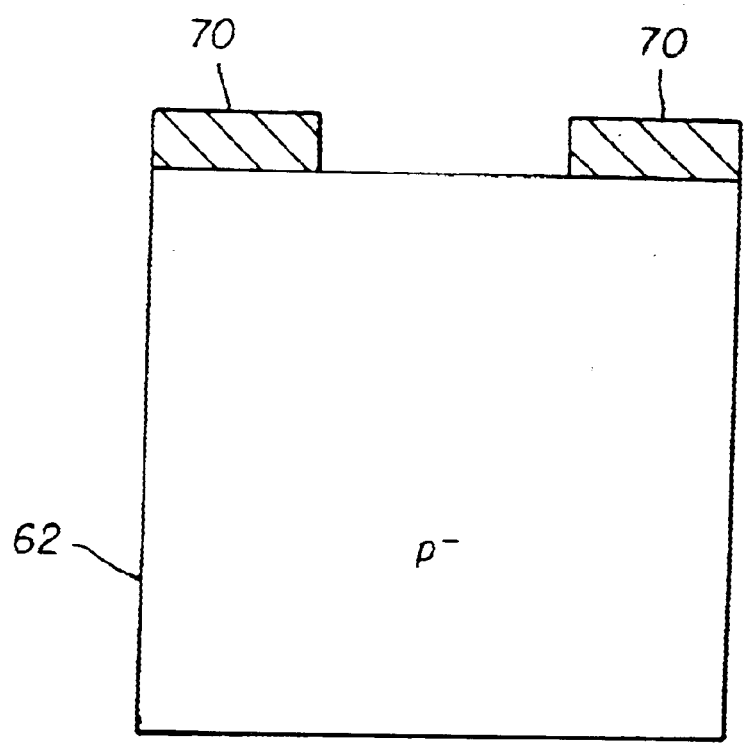
FIG. 7 illustrates an oxide deposition and etching step in the process used to form the power MISFET of FIG. 4.
Figure 8:
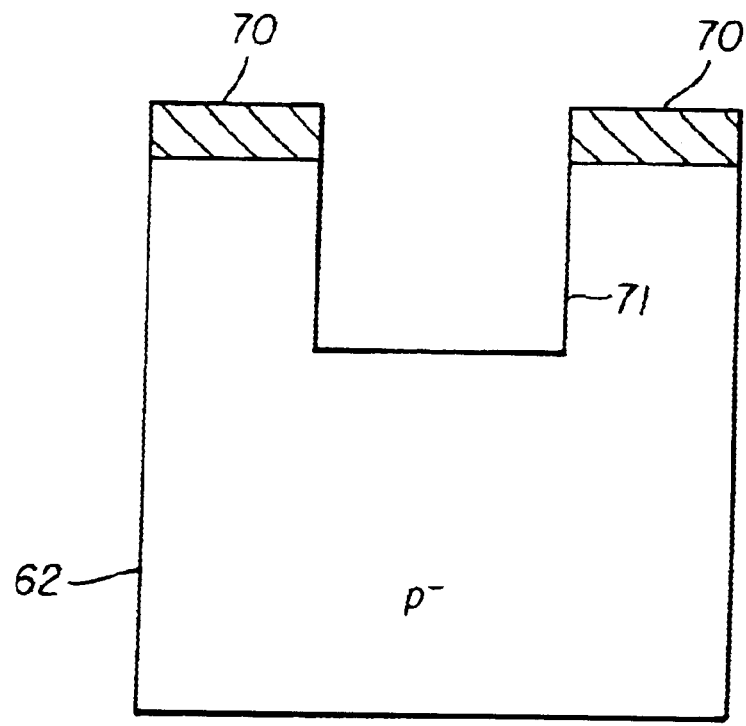
FIG. 8 illustrates a silicon trench etching step in the process used to form the power MISFET illustrated in FIG. 4.
Figure 9:
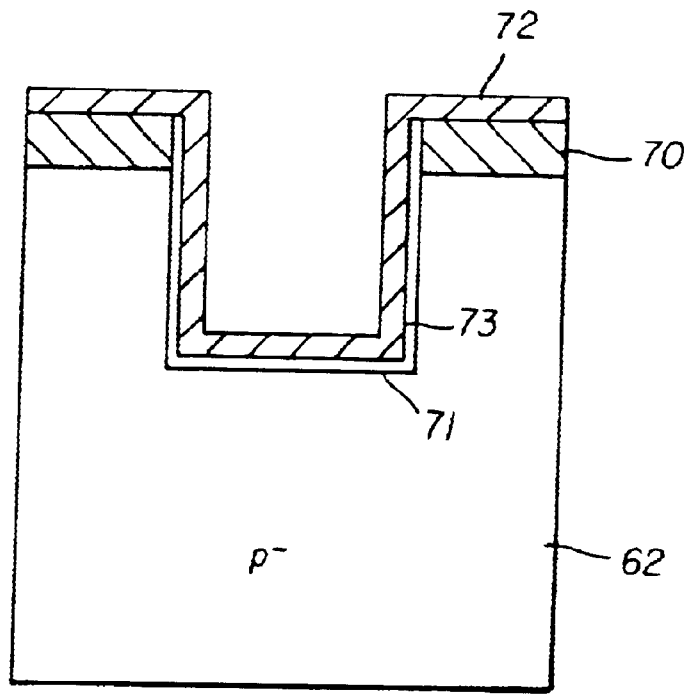
FIG. 9 illustrates pad oxidation and nitride deposition in the process used to form the power MISFET of FIG. 4.
Figure 10:
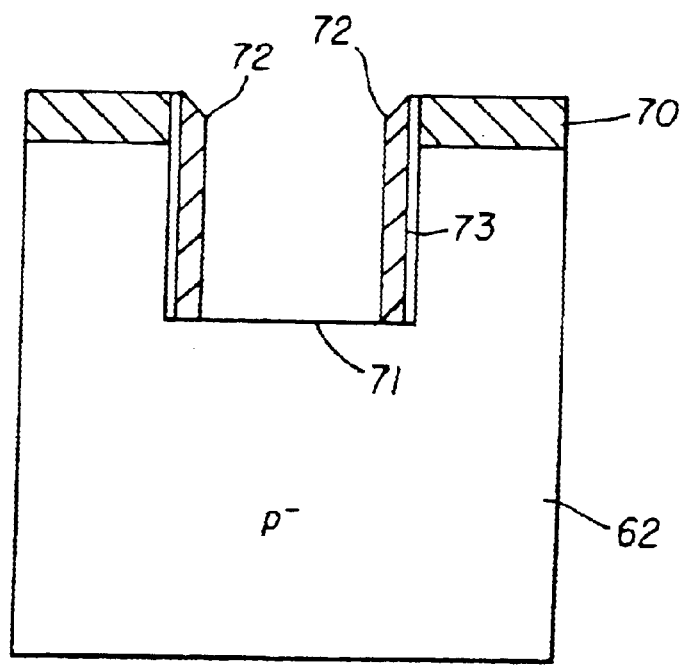
FIG. 10 illustrates nitride etching in the process used to form the power MISFET of FIG. 4.
Figure 11:
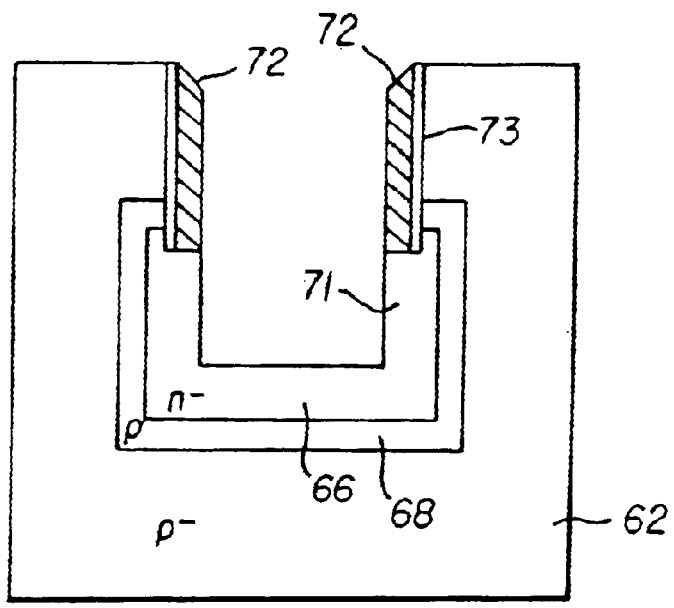
FIG. 11 illustrates silicon trench etching a p-body/n-drain formation in the process used to form the power MISFET of FIG. 4.

Process flow of the Trench Lateral MISFET is will now be described with reference to FIGS. 7–17. First, an oxide film 70 is deposited on the p-type substrate 62 and then selectively etched after photolithography (first mask) as shown in FIG. 7. The silicon substrate 62 is then etched by RIE to form a trench 71, as illustrated in FIG. 8, and a pad oxide 73 is grown in the trench. Following the growth of the pad oxide 73, a silicon nitride layer 72 is deposited on the pad oxide film 73 (FIG. 9) and etched by RIE to leave residual portions of the nitride layer 72 on side-walls of the trench 71 as shown in FIG. 10. Thereafter, the silicon substrate 62 is etched by RIE once again to extend the depth of the trench 71 past the residual nitride layer 72. Tilted ion-implantation of boron is then performed at the side-walls of the trench 71 and the boron is driven into the substrate 62 to create the p body 68. Next, tilted ion-implantation of phosphorus is performed and annealed to create the n⁻ extended drain 66 as shown in FIG. 11.

Figure 12:
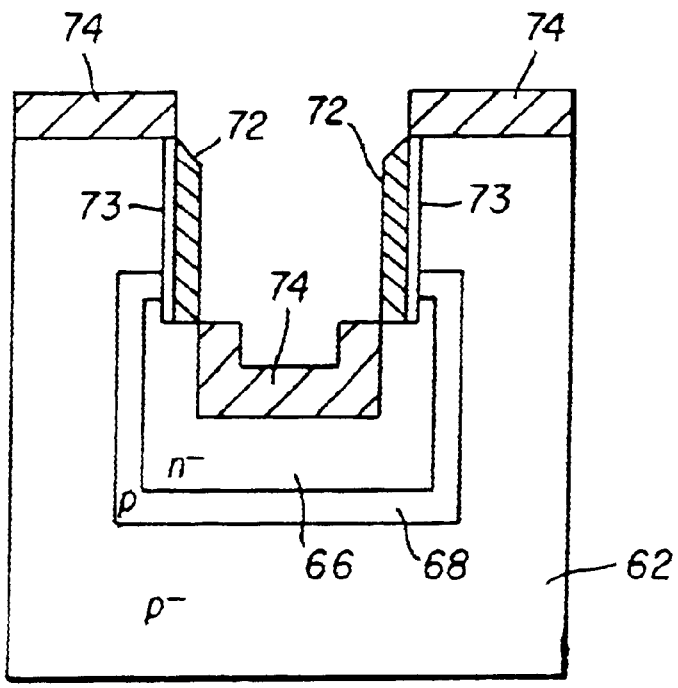
FIG. 12 illustrates formation of a thick oxide layer in the process used to form the power MISFET of FIG. 4.
Figure 13A:
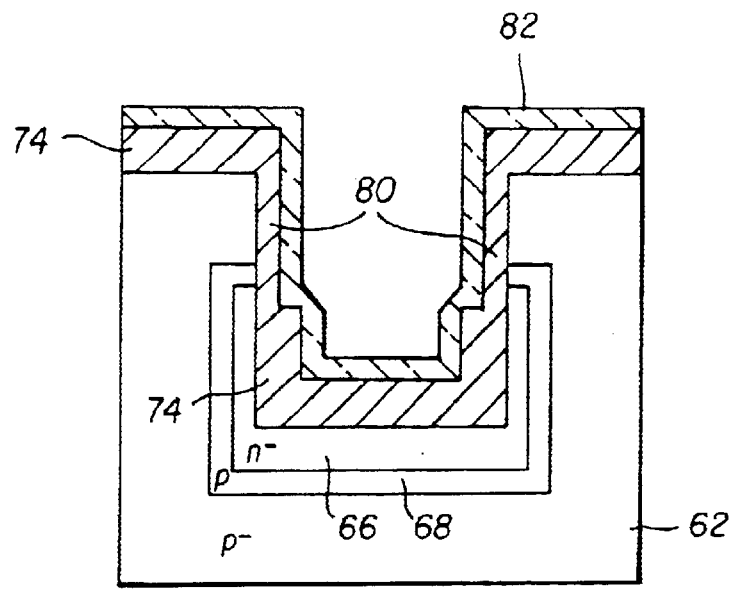
FIGS. 13(a), 13(b) illustrate gate oxidation and polysilicon gate deposition in the process used to form the power MISFET along lines A–B and C–D of FIG. 4, respectively.
Figure 13B:
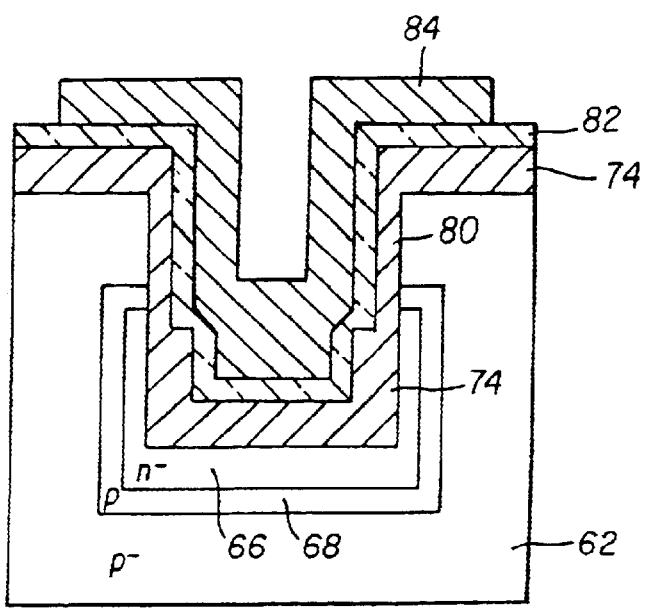
Figure 14A:
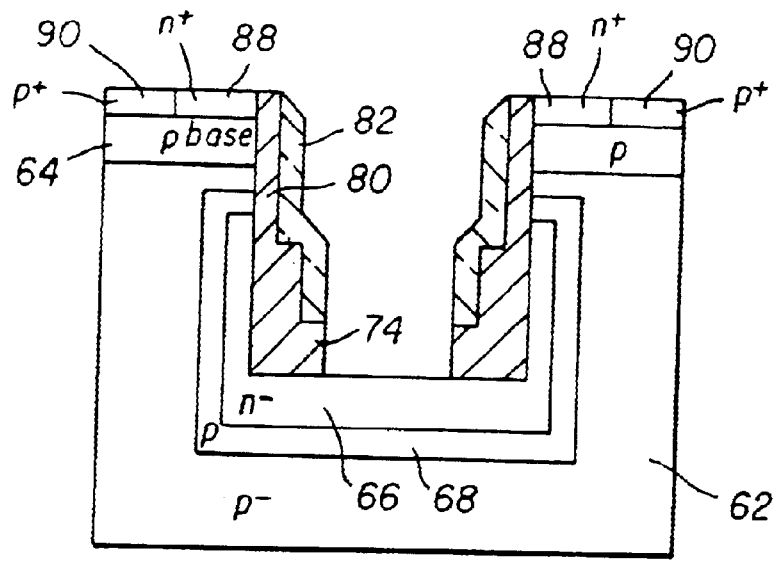
FIGS. 14(a), 14(b) illustrate polysilicon gate definition and formation of p-base and n+ and p+ regions in the process used to form the power MISFET along lines A—B and C–D of FIG. 4, respectively.
Figure 14B:
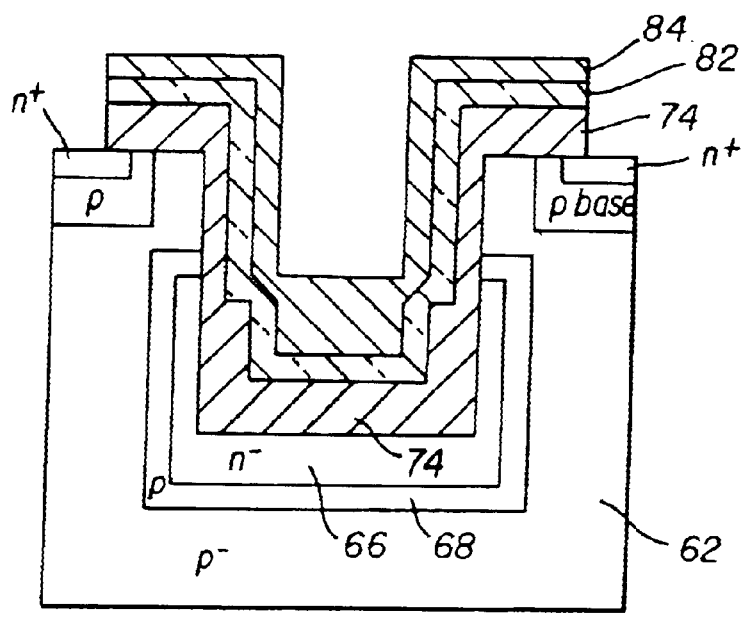
Figure 15A:
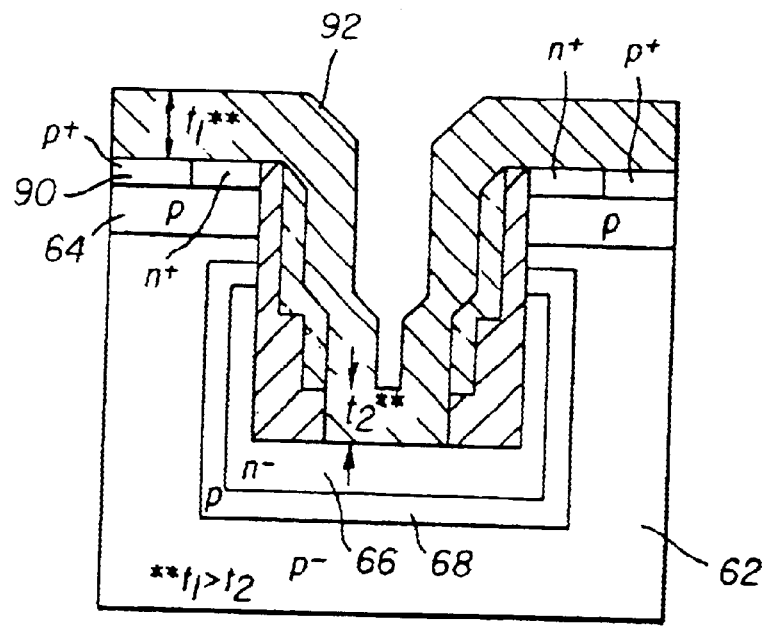
FIGS. 15(a), 15(b) illustrate oxide deposition in the process used to form the power MISFET along lines A-B and C–D of FIG. 4, respectively.
Figure 15B:
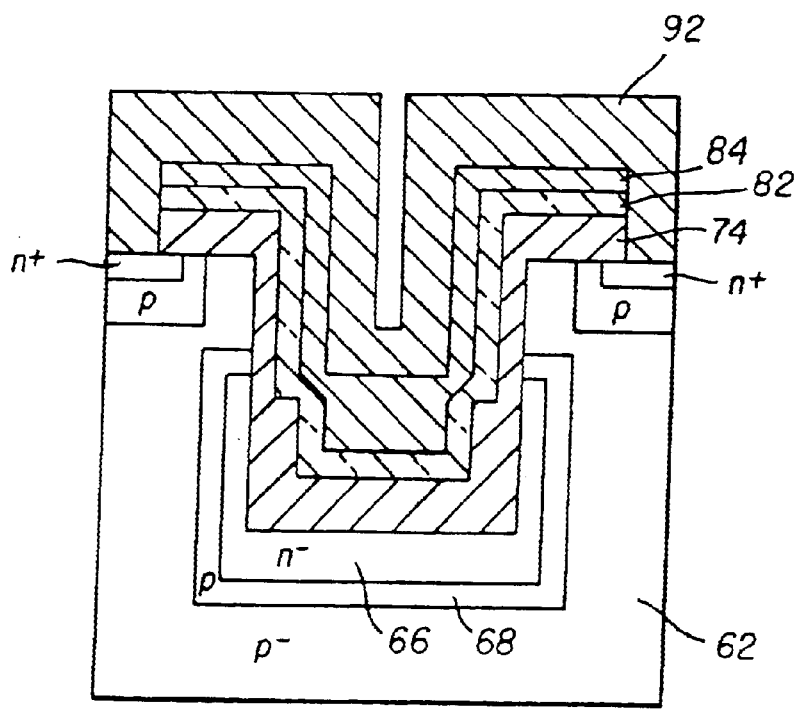
Figure 16A:
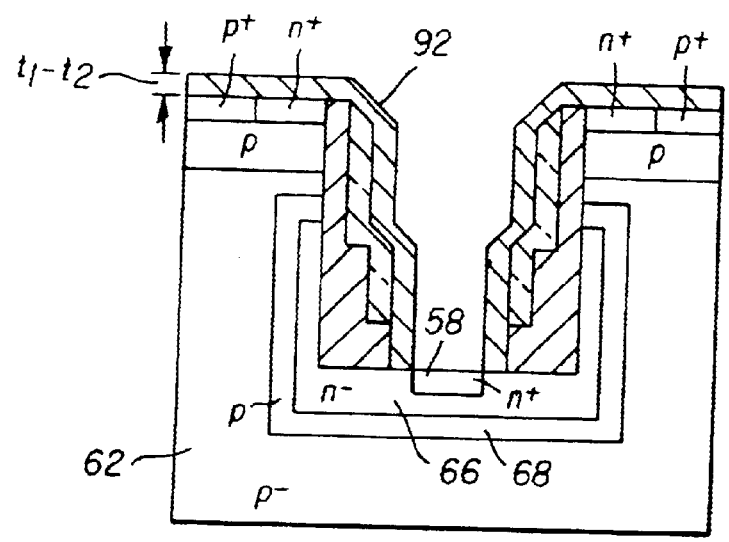
FIGS. 16(a), 16(b) illustrate oxide etching and n+ region formation at the bottom of the trench in the process used to form the power MISFET along the lines A–B and C–D of FIG. 4, respectively.
Figure 16B:
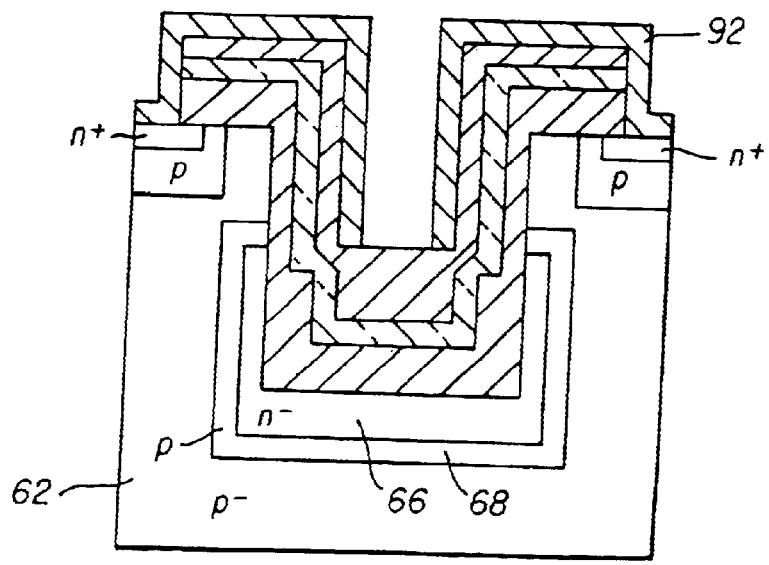
Figure 17A:
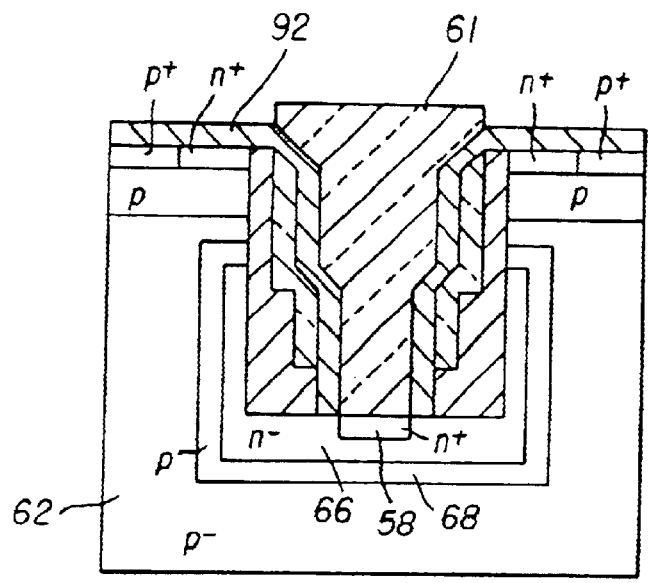
FIGS. 17(a), 17(b) illustrate polysilicon drain definition in the process used to form the power MISFET along the lines A–B and C–D of FIG. 4, respectively.
Figure 17B:
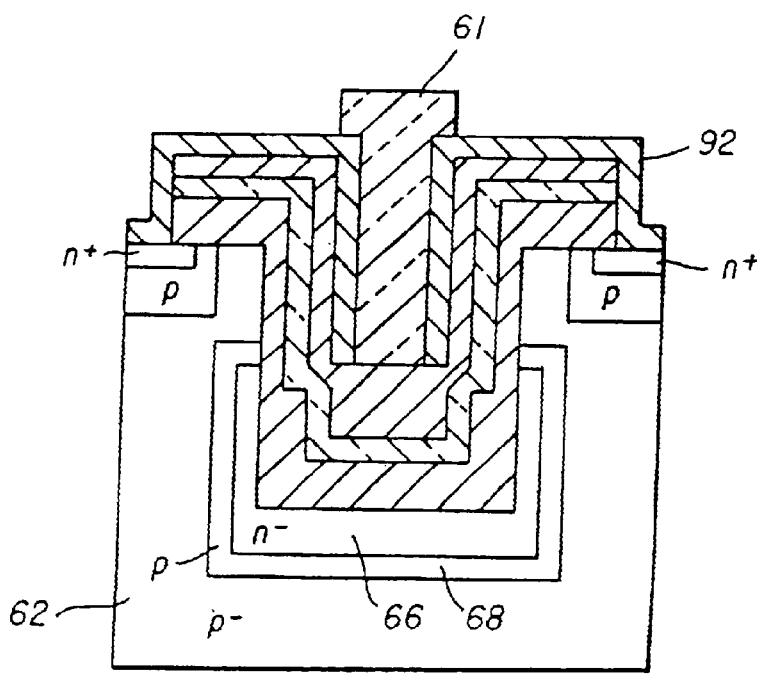
Figure 18A:
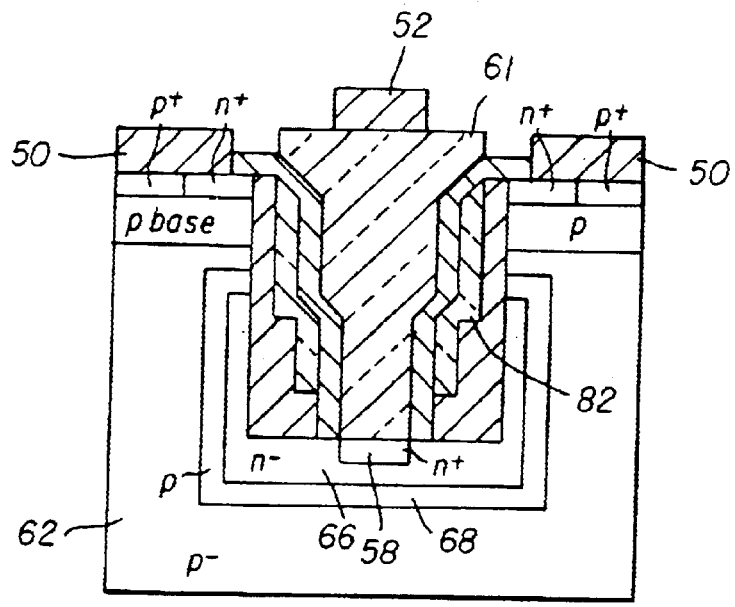
FIGS. 18(a), 18(b) illustrate contact opening and metallization in the process used to form the power MISFET along the lines A–B and C–D of FIG. 4, respectively.
Figure 18B:
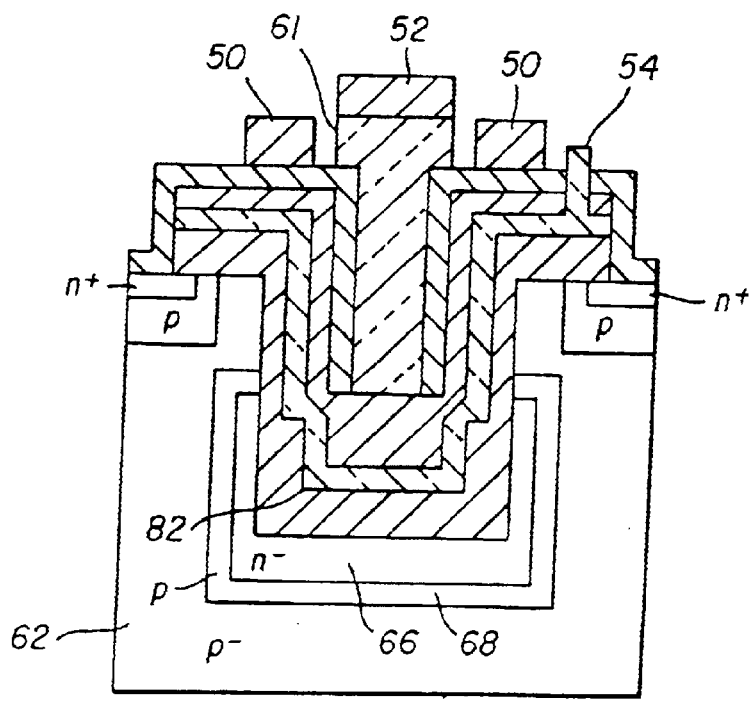

Wet oxidation is used to grow a thick oxide layer 74 at the surface of the substrate 62 and at the lower portions of the sidewalls, which extend beyond the residual nitride layer 72, and bottom of the trench 71 as shown in FIG. 12. The residual nitride layer 72 and the pad oxide 73 are then removed. A gate oxide layer 80 and gate polysilicon layer 82 are then deposited, and followed by the deposition of a further oxide layer 84. The oxide layer 84 at the top is selectively etched using a second mask to define the actual gate region as shown in FIGS. 13(a), 13(b). Next, the polysilicon layer 82 and the thick oxide 74 are etched with RIE and residual portions of polysilicon layer 82 and the thick oxide 74 are left at the side-walls. Thereafter, p base ion-implantation is performed selectively using a third mask and annealed to form the p base 64. This step is followed by the formation by ion implantation of an n+ region 88 and p+ region 90 of the source region 60 using fourth and fifth masks, respectively, as shown in FIGS. 14(a),14(b). An oxide layer 92 is then deposition by LPCVD as shown in FIGS. 15(a), 15(b). Because the reactants do not migrate rapidly along the surface at the temperature used for LPCVD, the thickness $t_2$ of the oxide inside the trench is thinner than the thickness of the oxide $t_1$ at the surface of the substrate ($t_2 < t_1$). RIE is then used to create a contact hole at the bottom of the trench as shown in FIG. 16(a), namely, since RIE has strong directional etching properties, the oxide film 92 at the bottom of the trench 71 is completely removed and silicon substrate 62 is exposed. On the other hand, the oxide 92 at the side-walls and at the top surface is retained and is thick enough to provide good electrical isolation between the gate and the drain. An n+ drain region 58 is formed at the bottom of the trench by ion-implantation shown in FIG. 16(a). Thereafter, the polysilicon plug 61 is deposited to fill the trench and patterned using a sixth mask as shown in FIGS. 17(a), 17(b). Finally contact windows are opened, using a seventh mask, at the surface of the substrate, and metal is deposited for the source electrode 50, drain electrode 52 and gate electrode 54 as illustrated in FIG. 18 using an eighth mask.

Figure 2:
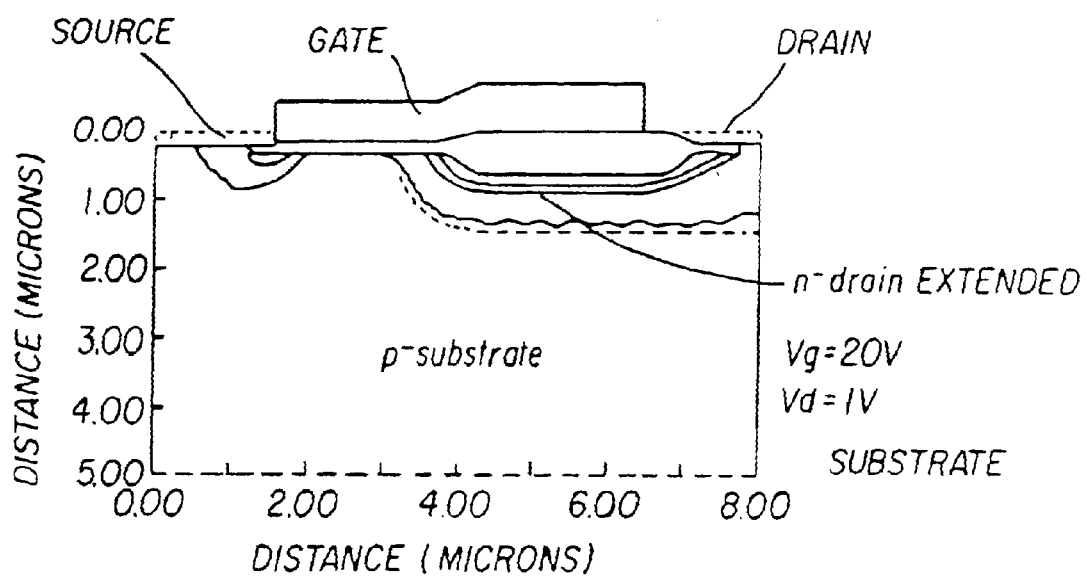
FIG. 2 shows on-state simulation for the conventional lateral power MISFET of the type illustrated in FIG. 1.
Figure 3:
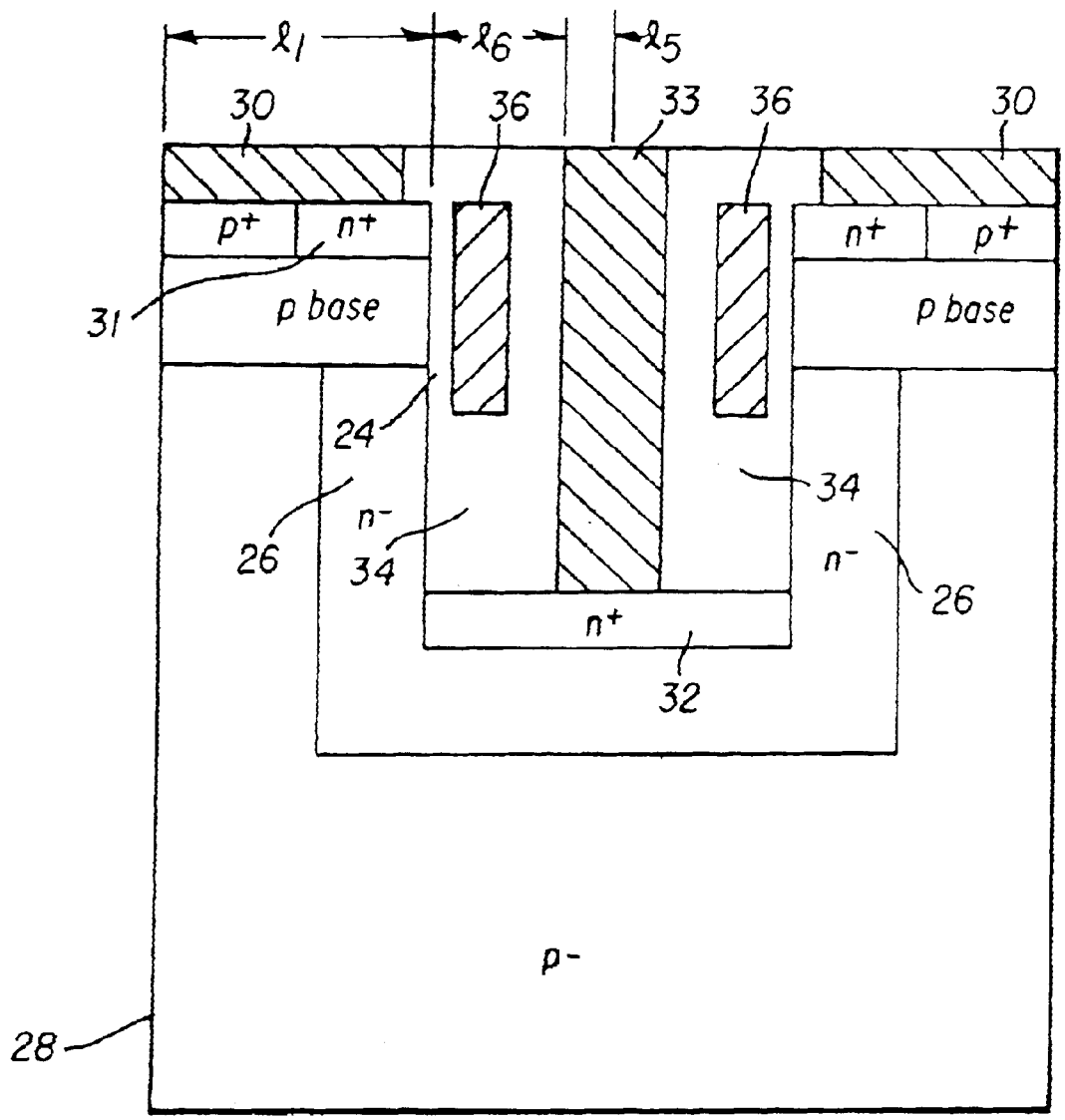
FIG. 3 is a cross-sectional view of a trench lateral power MISFET.
Figure 19:
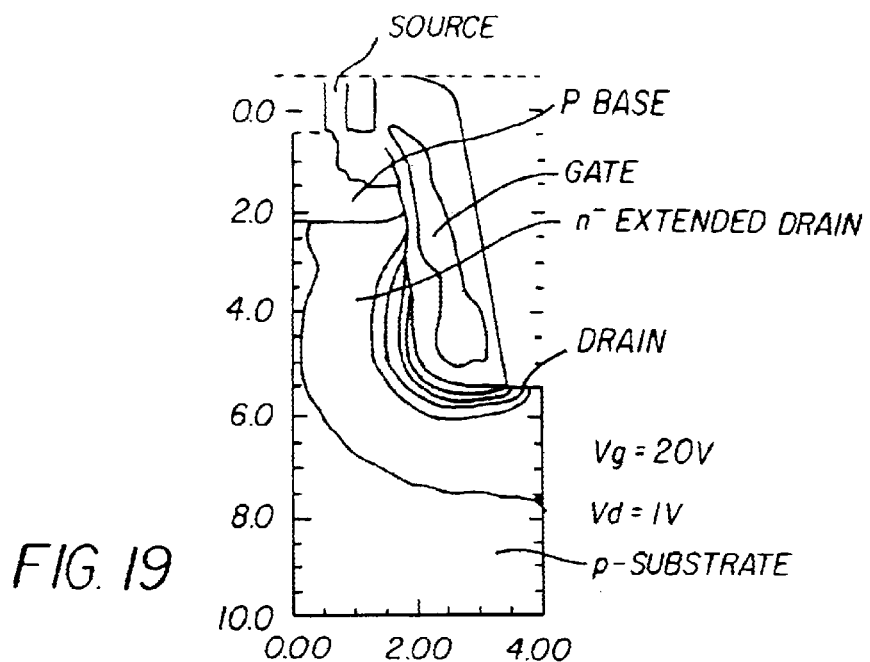
FIG. 19 illustrates on-state simulation for the trench lateral power MISFET illustrated in FIG. 4.

Process and device simulation was performed for the Trench Lateral MISFET utilizing the same doping levels and junction depths for the simulation illustrated in FIG. 2. A result for the on-state characteristics of the device is shown in FIG. 19. From these simulations, the specific on-resistance of 0.8 mΩ-cm² at a breakdown voltage of 80V.

Figure 20:
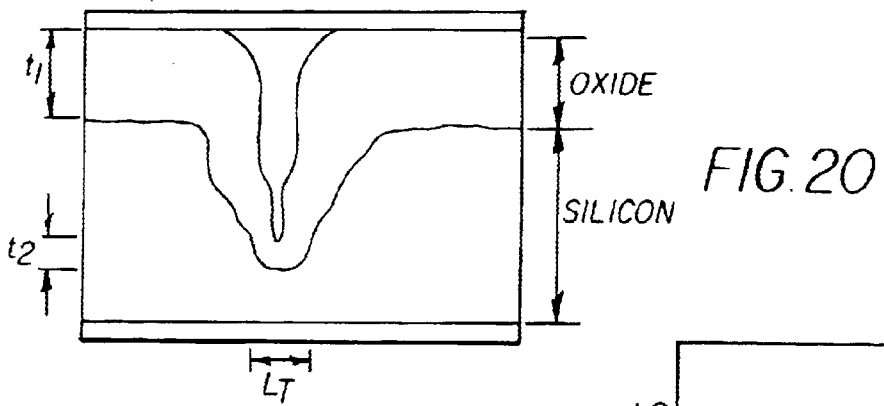
FIG. 20 is an SEM micrograph after oxide deposition.
Figure 21:
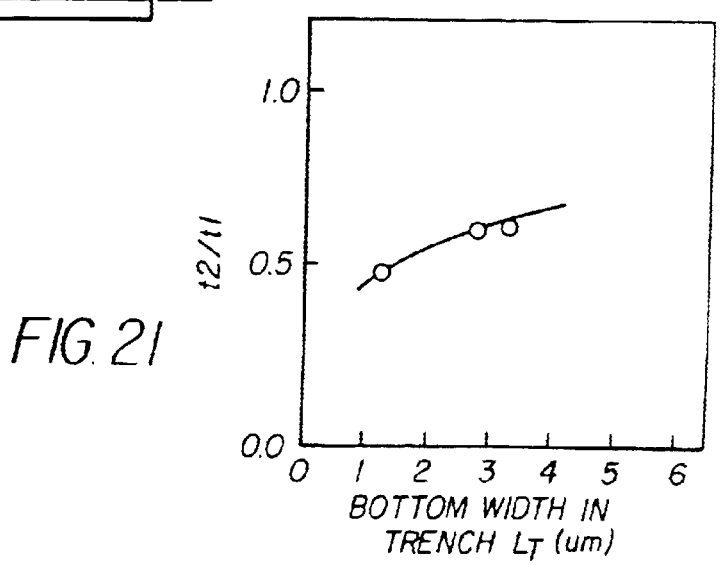
FIG. 21 illustrates the ratio of oxide thickness between surface and bottom as a function of trench width.
Figure 22:
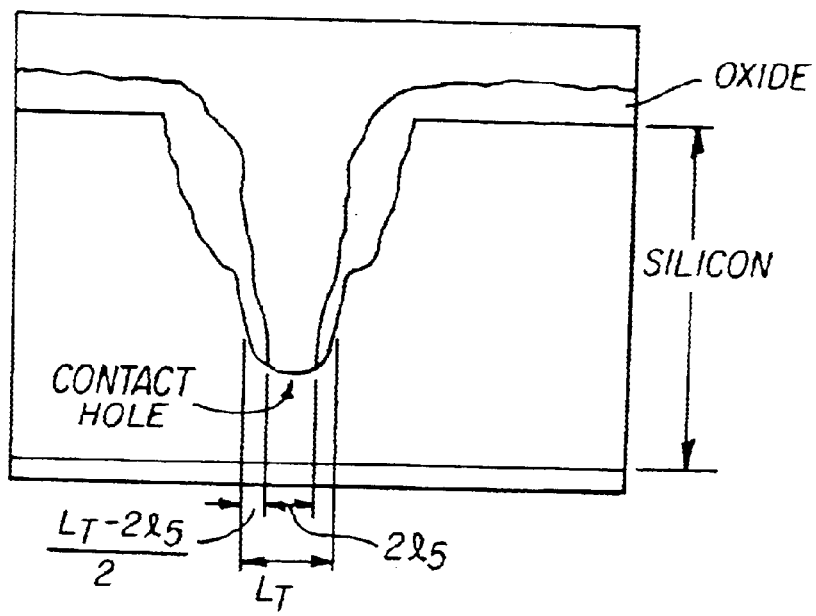
FIG. 22 is an SEM micrograph after RIE etching of oxide.
Figure 23:
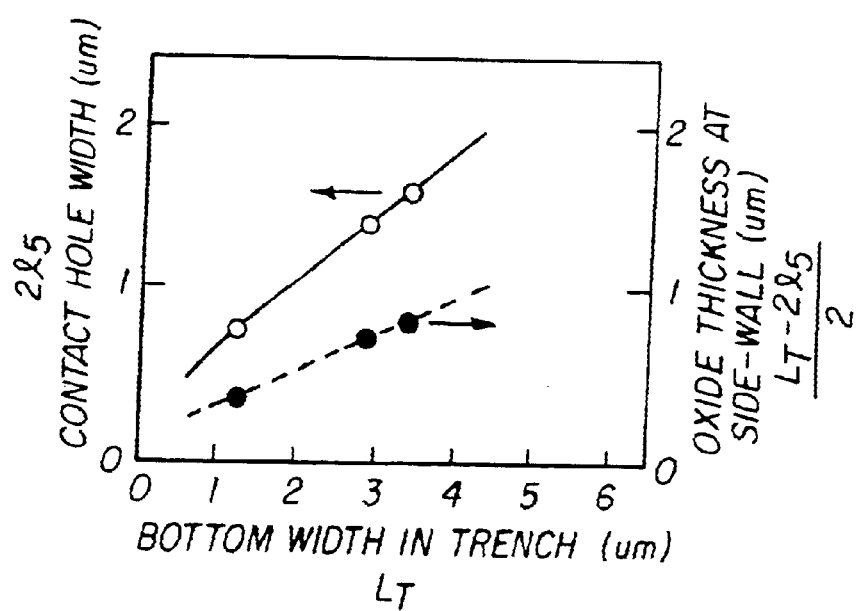
FIG. 23 illustrates the size of the contact hole and oxide thickness at side-wall as a function of trench width.

An experimental verification of the feasibility of the trench bottom contact implementation is illustrated in the SEM micrographs of FIGS. 20 and 21. FIG. 20 shows the trench after the deposition of the thick oxide. In this case, the deposited oxide thickness $t_1$ at the surface is 2.5 μm, while the oxide thickness $t_2$ at the bottom of the trench is 1.2 μm, and the trench bottom width $2 \times l_5$ is 1.3 μm. The ratio of oxide thickness between the surface and the trench bottom as a function of the bottom trench width is illustrated in FIG. 21. FIG. 22 shows the defined bottom contact. The contact hole realized by RIE has a width $t_4$ of 0.7 μm in a 3.5 μm deep trench with a side-wall oxide thickness $t_5$ of 0.3 μm. Size of the contact holes and the oxide thicknesses at the side-wall are shown as a function of trench width in FIG. 23.

Figure 24:
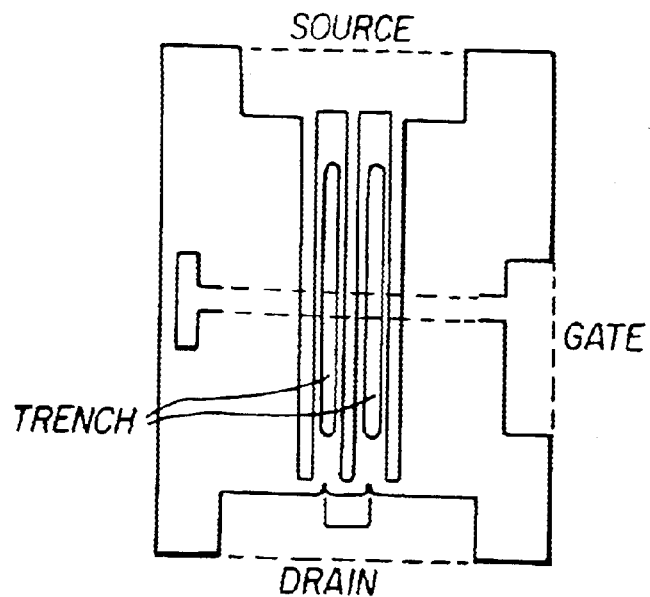
FIG. 24 SEM micrograph of a top view of a lateral trench power MISFET in accordance with the invention.
Figure 25:
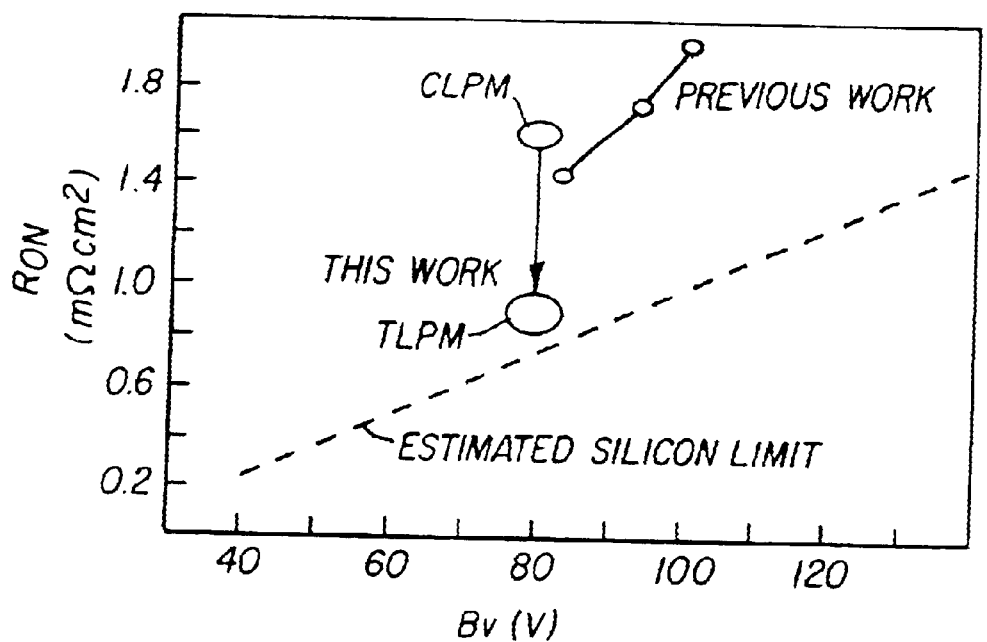
FIG. 25 is a graph illustrating trade-offs between specific on-resistance and breakdown voltage.

The invention makes it possible to increase packing density of the MISFET while keeping current handling capability in the unit area high resulting in significant reduction of specific on-resistance for the MISFET. FIG. 24 is a SEM micrograph of a top view of a lateral trench MISFET in accordance with the invention. The trench lateral MISFET exhibits one of the lowest specific on-resistance values ever reported as illustrated in FIG. 25. See, for example, T. Efland, et al., "An Optimized RESURF LDMOS Power Device Module Compatible with Advanced Logic Processes" IEDM Tech Dig., pp. 237–240, 1992, the contents of which are incorporated herein by reference.

Figure 26:
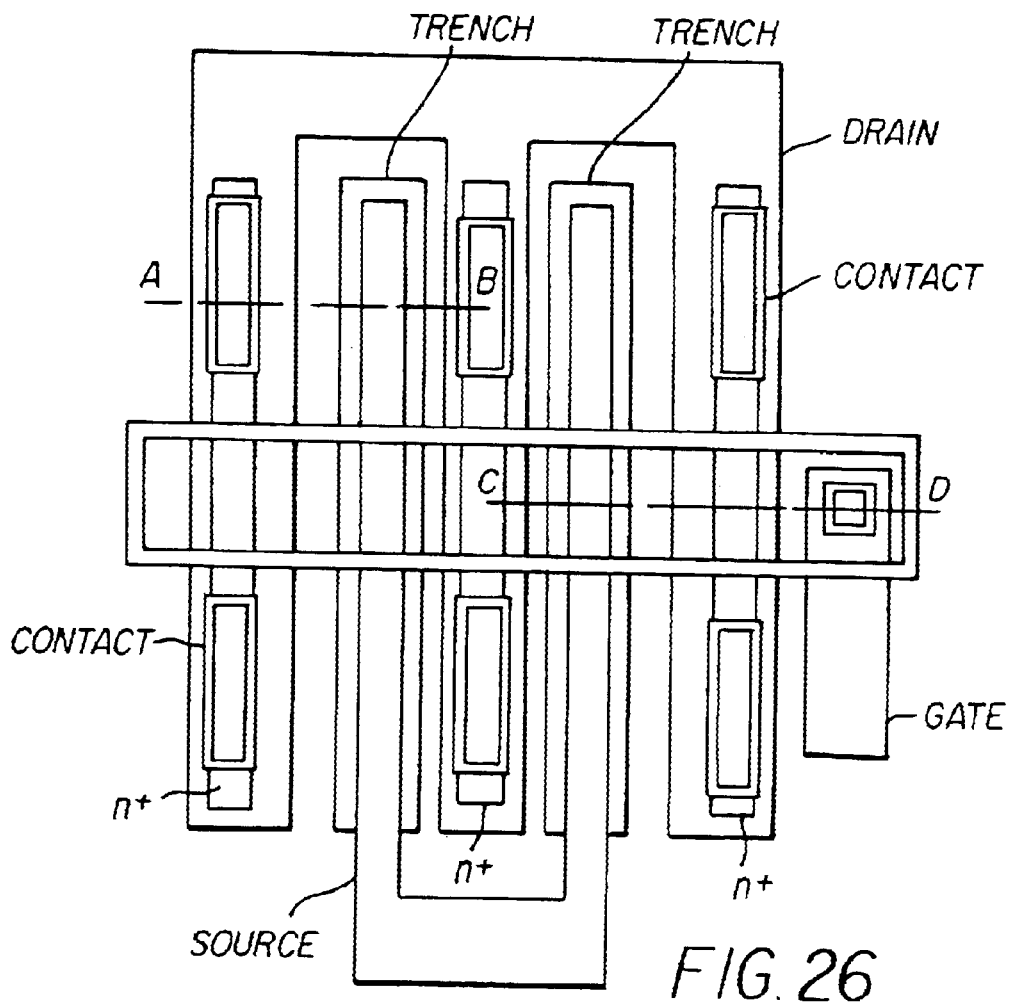
FIG. 26 is a top view of a trench lateral MISFET according to a second embodiment of the invention.

In second embodiment of the invention, the structure of the device is modified to improve switching performance. The objective of this work is to implement a device structure with a trench bottom contact hole for the source which offers a smaller Miller capacitance in order to improve switching performance of the device. In order to realize a smaller Miller capacitance, a source is formed at the bottom of the trench. A top view and a cross-sectional view of the improved trench lateral MISFET are respectively shown in FIGS. 26 and 27.

Figure 27A:
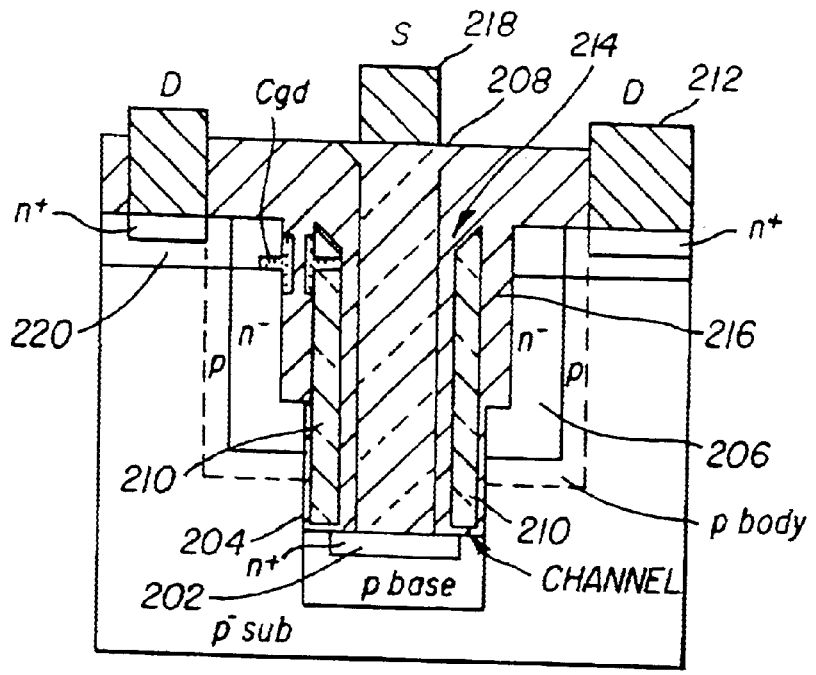
FIG. 27 is a cross-sectional view of the trench lateral MISFET illustrated in FIG. 26.
Figure 27B:
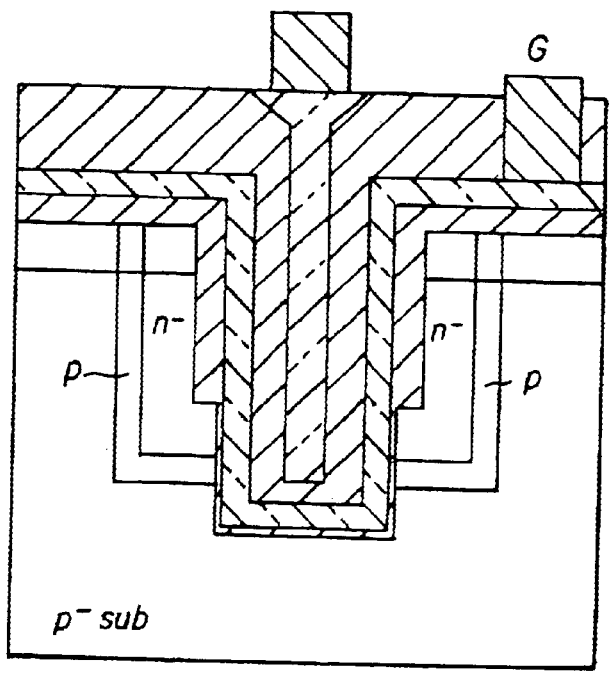

The major difference between the second embodiment shown in FIG. 27 and the first embodiment, shown in FIG. 15, is that a source 202 is formed at the bottom of a trench 204 and an extended drain 206 is located at the upper portion of the trench sidewall. One of the advantages of this structure is that Cgd (Miller capacitance) would be reduced to less than half of that of the first embodiment because the plugged polysilicon 208 at the bottom of the trench 204 contacts the source 202 instead of the drain 206. Thus Cgd is generated only between the gate 210 and n⁻ drain 206.

The process to manufacture the second embodiment will utilize a self-aligned method to form the gate electrodes and the trench bottom contact holes to the source to achieve minimum pitch and very low on-resistance. The source contact holes will be filled with polysilicon to access the bottom source from the surface and to level the surface for metal formation.

The MISFET shows a driving current of 55 mA per mm of channel width and a specific on-resistance of 0.8 mΩ-cm² for an 80 V device when the design uses a 1 μm minimum feature size. When a 0.6 μm feature size were allowed, then the specific on-resistance of the MISFET would become 0.7 mΩ-cm² for an 80 V device.

As shown in FIG. 27, the MISFET is formed along the sidewalls of the trenches. The drain contact 212 is located at the surface. The channel, n⁻ drain 206, gate oxide 214, thick oxide 216, and gate electrode 210 are formed along the sidewalls. The n⁺ source 202 at the bottom of the trench 204 is connected and brought to the surface through a polysilicon plug 208. When a positive bias, higher than the threshold voltage, is applied to the gate 210, an inversion layer is created and an electron current flows from the source electrode 218 through the polysilicon plug 208 to the n$^+$ source 202 at the bottom of the trench 204, and is collected by the drain 220 at the surface. In order to decrease the electric field under the gate 210, a thick oxide 216 is used at the top of the sidewall. The (100) sidewall plane, which has been shown to have the lowest interface-trap density and the highest surface electron mobility, is used in the implementation of the device by orienting the main sidewall plane 45° away from the <110> axis of the (100) orientation wafer. In addition, the current in the n$^-$ drain 206 flows mainly in the bulk instead of at the surface, thus avoiding mobility degradation due to damage associated with trench formation.

Figure 28:
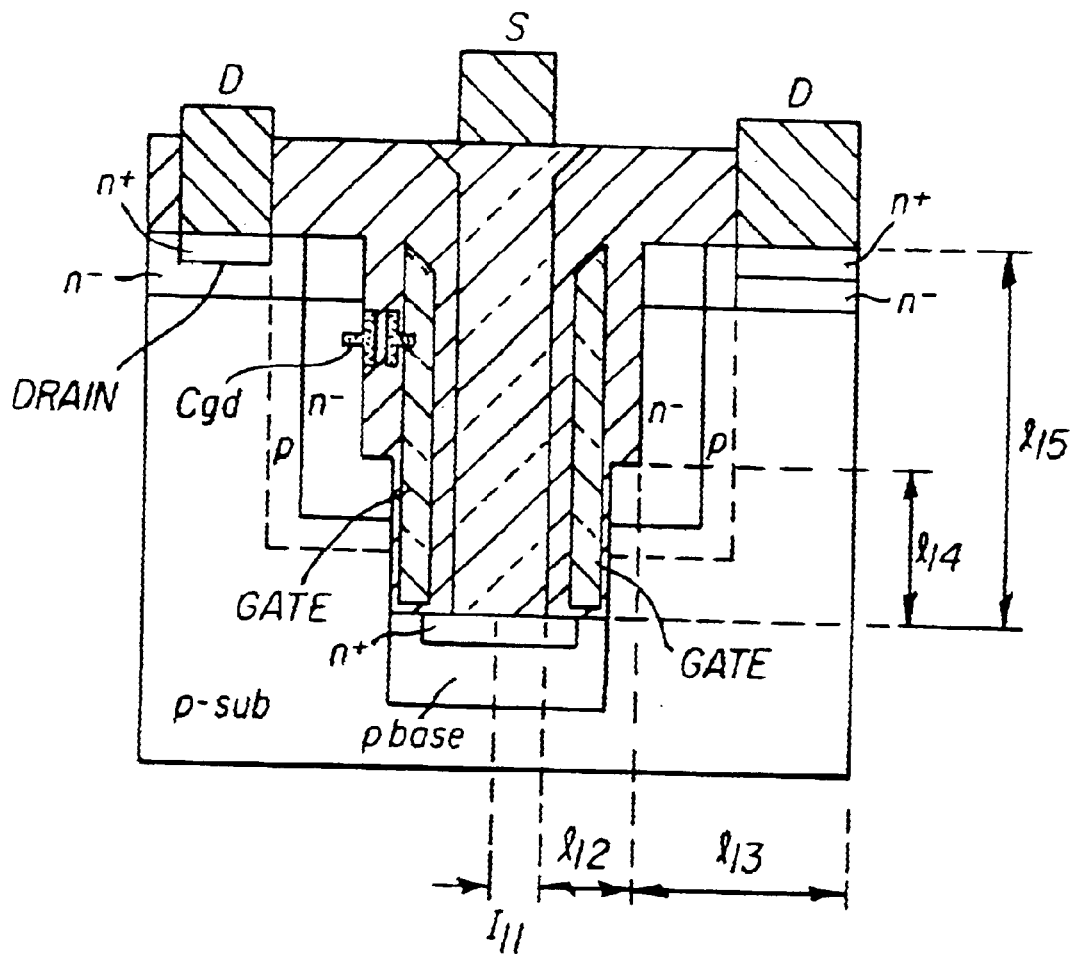
FIG. 28 is a cross-sectional view of the trench lateral MISFET with device dimensions.

Brief explanation of device dimensions are described in FIG. 28. The depth of the second trench $l_{14}$ is about 2 μm. Total depth of the trench $l_{15}$ is about 5 μm. The length of the source contact $l_{11}$ the distance between the source and drain $l_{12}$, and the length of the drain $l_{13}$ are 0.5, 2.0, and 1.5 μm, respectively under 1 μm design rule. Usage of 0.6 μm minimum feature size reduces $l_{11}$ and $l_{13}$ to 0.3 and 0.9 μm, respectively.

Figure 29:
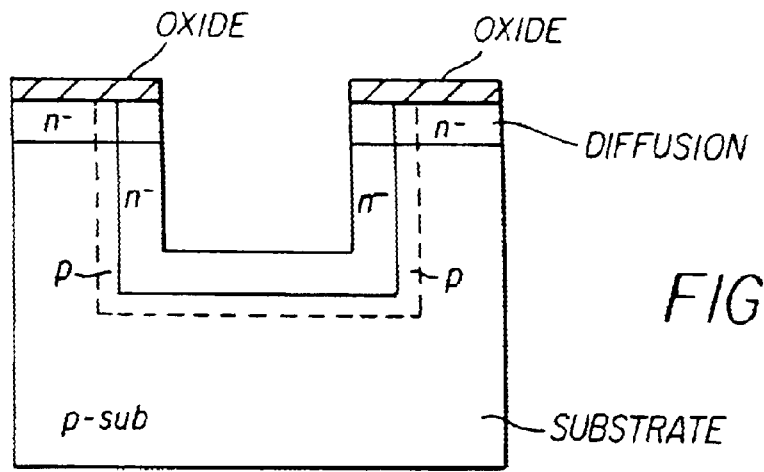
FIG. 29 is a cross-sectional view of silicon etching and p body/n⁻ drain formation.
Figure 30:
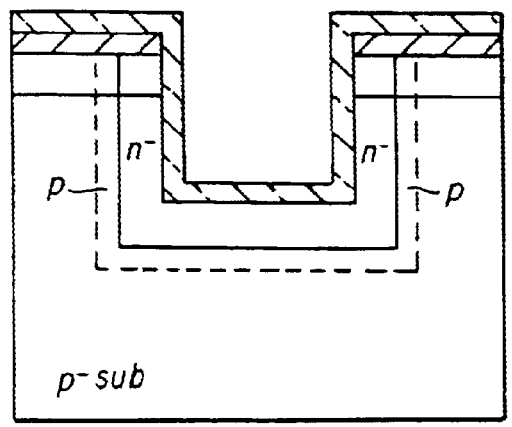
FIG. 30 is a cross-sectional view of P body/n⁻ drain drive and growth of thick oxide.
Figure 31:
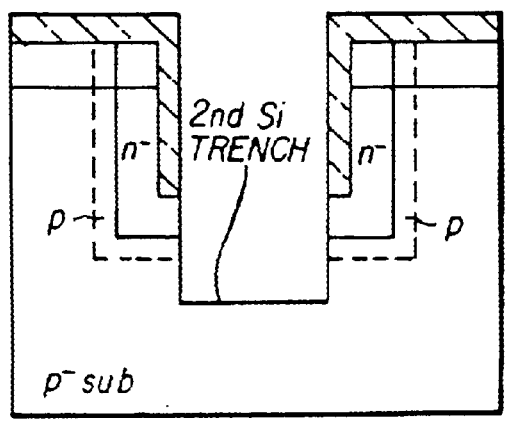
FIG. 31 is a cross-sectional view of oxide and second silicon trench etching.
Figure 32:
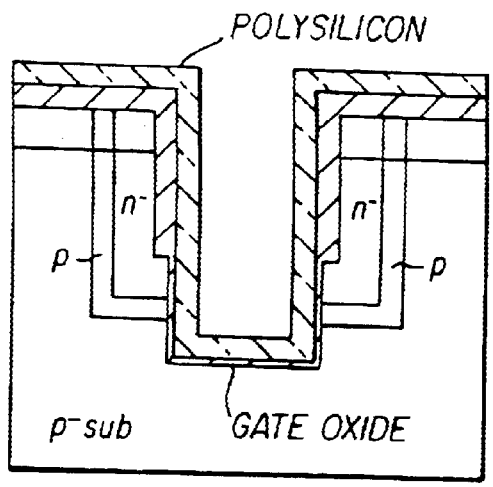
FIG. 32 is a cross-sectional view of gate oxidation, polysilicon deposition.
Figure 33A:
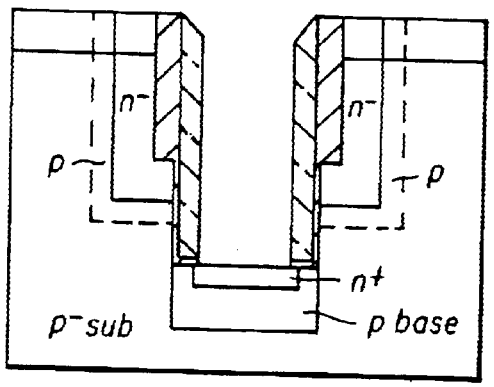
FIG. 33 is a cross-sectional view of mask oxide patterning, RIE of polysilicon and p base/n⁺ source formation.
Figure 33B:
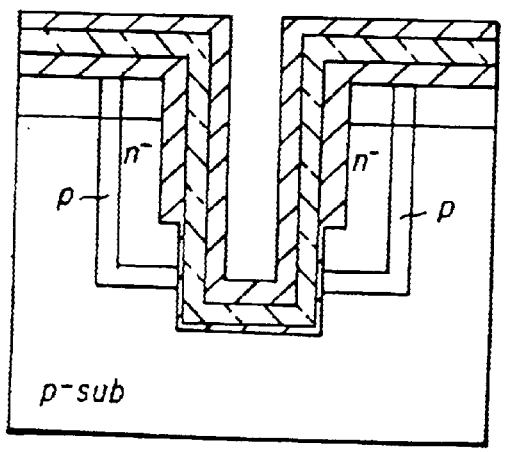

The process used in the fabrication of the second embodiment is illustrated in FIGS. 29 to 36. First, n$^-$ diffusion is performed using the first mask. The obtained junction depth and surface concentration of the diffusion are about 1 μm and 1e17-cm$^{-3}$, respectively. Then a shallow trench whose depth is 3 μm is etched in a p-type silicon substrate using the second mask. Thereafter the p body and n$^-$ drain are formed by using tilted ion-implantation (FIG. 29). After the p body and n$^-$ drain are driven, wet oxidation is performed to grow a thick oxide at the bottom of the trench as well as at the surface. The junction depth of the n$^-$ drain is about 1 μm. The surface concentration of the n$^-$ drain is about 1e17-cm$^{-3}$. The thickness of the grown oxide is about 0.5 μm (FIG. 30). Next, the oxide and the second silicon trench is etched using RIE. The additional etching depth $l_{14}$ is 2 μm. Since RIE etching is anisotropic, most of the oxide remains on the sidewall (FIG. 31). After the 0.1 μm gate oxide is formed, polysilicon with a thickness of 0.5 μm is deposited (FIG. 32). A further oxide layer is deposited on the surface. The oxide layer at the top is selectively etched using the third mask to define the actual gate area. The polysilicon is etched by RIE using the top oxide layer as a mask. Then the p base and n$^+$ region are formed using 4th and 5th masks. The junction depths of the p base and n$^+$ region are 1.0 and 0.2 μm, respectively. The surface concentration of the n$^+$ is 1e20-cm$^{-3}$ (FIGS. 33 (*a*) and (*b*)).

Figure 34A:
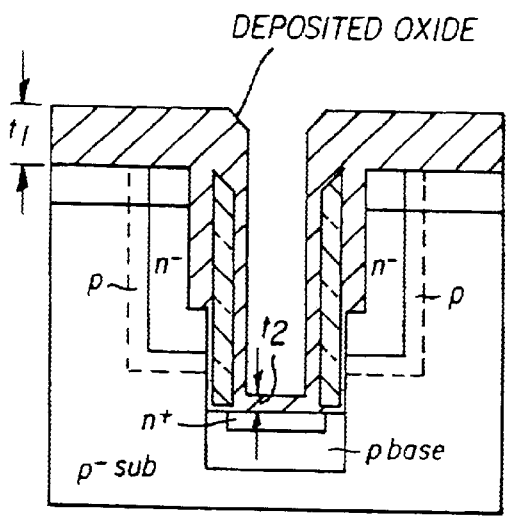
FIGS. 34(a), 34(b) illustrate deposition of oxide by CVD along the lines A–B and C–D of FIG. 26, respectively.
Figure 34B:
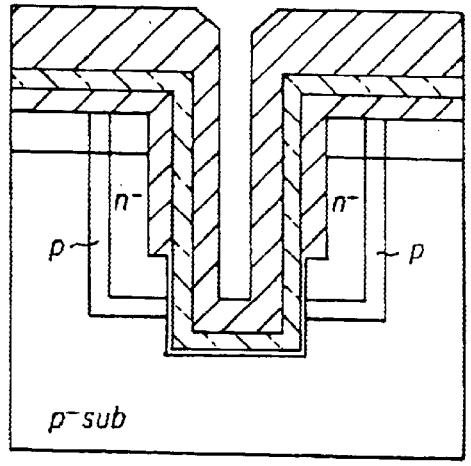
Figure 35A:
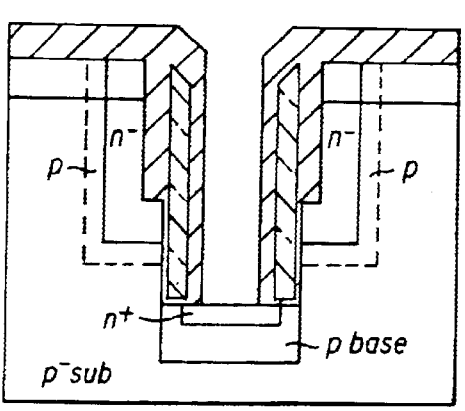
FIGS. 35(a), 35(b) illustrate the source contact hole opening along the lines A–B and C–D of FIG. 26, respectively.
Figure 35B:
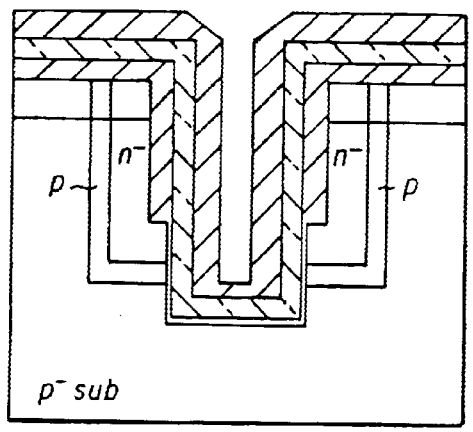
Figures 36A, 36B:
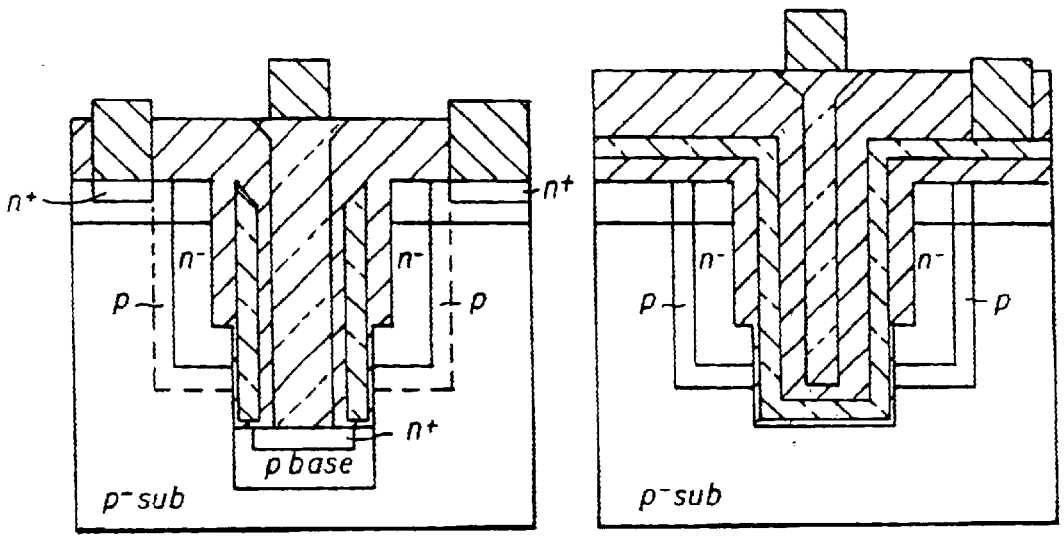
FIGS. 36(a), 36(b) illustrate source polysilicon deposition, leveling, contact opening and metallization along the lines A–B and C–D of FIG. 26, respectively.

A critical part of the process is the creation of contact holes at the bottom of the trench. A 1.0 μm oxide layer is deposited by CVD in the trench as illustrated in FIG. 34 (*a*) and (*b*). Because the reactants do not migrate rapidly along the surface at the temperature of about 400° C. used for CVD, the oxide inside the trench is thinner than that at the surface ($t_2 < t_1$) [5]. RIE is then used to remove the oxide by 0.5 μm directionally. This creates a contact hole at the bottom of the trench as shown in FIG. 35(*a*). Since RIE has strong directional etching properties, the oxide film at the bottom of the trench is completely removed and the silicon is exposed. On the other hand, the oxide at the sidewalls and at the top surface is retained and is thick enough to provide good electrical isolation between the gate and the source.

Following contact hole formation, the contact hole is plugged with polysilicon then the polysilicon is patterned by the 6th mask. After contact holes are opened by the 7th mask, metallization is defined using the 8th mask (FIGS. 36(*a*) and (*b*)).

FIG. 38 lists a comparison of switching figure of merit between the first embodiment and second embodiment trench lateral MISFETs. Since the Cgd for the second embodiment MISFET is half of the first embodiment MISFET, the figure of merit for the second embodiment MISFET is twice as good as the conventional one.

Figure 37:
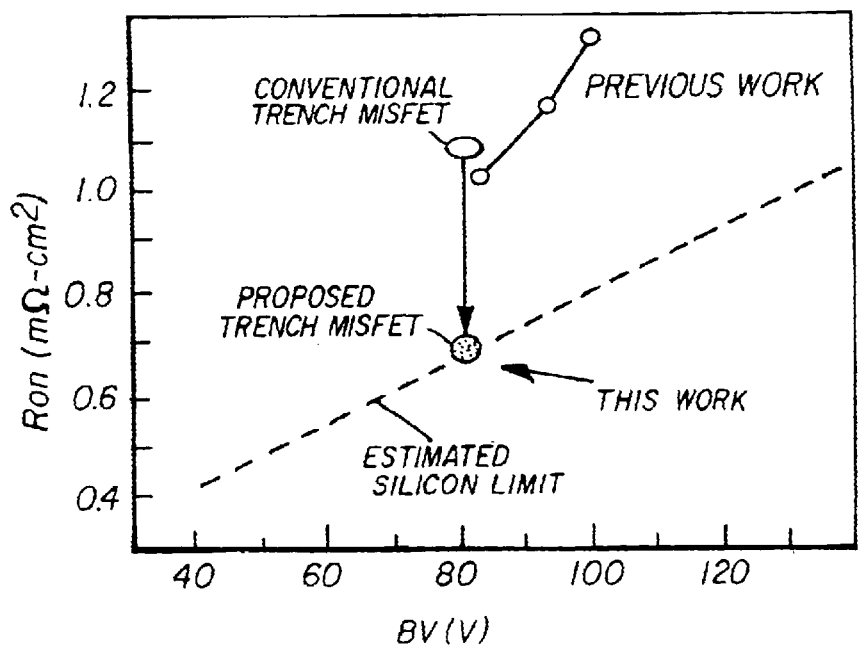
FIG. 37 is a graph of the trade-off between specific on-resistance and breakdown voltage.

Trade off between specific on-resistance and breakdown voltage is shown in FIG. 37. On-resistance of the proposed trench lateral MISFET will be reduced by about 50% (using a 0.6 μm minimum feature size), bringing it close to the silicon limit (0.7 mΩ-cm$^2$ for an 80 V device).

The invention has been described with reference to certain preferred embodiments thereof. It will be understood, however, that modifications and variations are possible within the scope of the appended claims. The method of forming the thick oxide inside the trench and creating contact holes at the trench bottom is useful not only for MISFETs, but can be employed to manufacture other devices including diodes, bipolar transistors, IGBTs and MESFETs and DRAM cells which require a contact at the bottom of a trench.

What is claimed is:

1. A method of manufacturing a MISFET comprising the steps of:
   a) forming a trench in a substrate of first conductive type;
   b) forming a first region of the first conductivity type and a second region of the second conductivity type into the substrate through portions of the trench;
   c) depositing an oxide layer on portions of sidewalls of the trench, wherein said oxide layer extends from the top of the trench;
   d) then forming an extended trench while retaining said oxide layer on the portions of the sidewalls of said trench;
   e) forming a gate oxide layer on the sidewalls of said extended trench;
   f) forming a gate layer on the gate oxide layer;
   selectively etching the gate layer, and the gate oxide layer so that the surface of the substrate is exposed in regions adjacent to the trench and residual films of the gate layer and the gate oxide layer are left on the sidewalls of the trench;
   g) forming a base of the first conductivity type and a source of the second conductivity type at the bottom of the trench;
   h) forming a second oxide layer inside the trench and on the surface of the substrate over a drain by a method where oxide growth rate is slower inside the trench than at the surface of the substrate, wherein the thickness of the second oxide layer within the trench is less than the thickness of the second oxide layer on the surface of the substrate;
   i) etching the oxide layer at the bottom of the trench to form a contact hole that extends to the substrate while maintaining a thickness of the second oxide layer on the sidewalls of the trench and surface of the substrate using a directional etching method; and
   j) forming an electrical interconnection material in the trench that extends through the contact hole.

2. A method of manufacturing an MISFET comprising:
   a) selectively forming a second conductivity type diffusion layer in a surface region of a first conductivity type silicon substrate;
   b) forming a first trench in the silicon substrate;

c) forming a first conductivity body and a second conductivity drain region in the silicon substrate by implantation through side walls of the first trench;

d) forming a thick oxide layer in the first trench and on the surface of the silicon substrate;

e) then etching through the thick oxide layer and into the silicon substrate to form a second trench;

d) forming a gate oxide layer in the second trench;

e) depositing a polysilicon layer over the gate oxide layer and the thick oxide layer;

f) forming a top oxide layer and selectively etching the top oxide layer to define a gate area;

g) etching the polysilicon layer using the top oxide layer as a mask;

h) forming a first conductivity type base region in the silicon substrate under the bottom of the second trench;

i) depositing an oxide layer in the second trench, wherein the oxide inside the second trench is thinner than that at the surface of the silicon substrate;

j) forming a contact hole at the bottom of the second trench;

k) filling the contact hole with polysilicon; and l) opening contact windows in the polysilicon and filling the contact holes with metal.

* * * * *